United States Patent
Gopal et al.

(10) Patent No.: US 9,584,155 B1
(45) Date of Patent: Feb. 28, 2017

(54) LOOK-AHEAD HASH CHAIN MATCHING FOR DATA COMPRESSION

(71) Applicant: Intel Corporation, Santa Clara, CA (US)

(72) Inventors: Vinodh Gopal, Westborough, MA (US); James D. Guilford, Northborough, MA (US); Gilbert M. Wolrich, Framingham, MA (US); Daniel F. Cutter, Maynard, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/864,458

(22) Filed: Sep. 24, 2015

(51) Int. Cl.
*H03M 7/00* (2006.01)
*H03M 7/30* (2006.01)

(52) U.S. Cl.
CPC ................ *H03M 7/3086* (2013.01)

(58) Field of Classification Search
CPC .... H03M 7/3088; H03M 7/3086; H03M 7/30; H03M 7/3084; H03M 13/09; H03M 7/40; H03M 13/096; H03M 7/3059; H03M 7/3082; H03M 7/4093; H03M 7/42; H03M 7/46; H04L 69/04; H04L 67/28; H04L 67/2828
USPC ........ 341/65, 67, 106, 107, 94, 95; 709/238, 709/747, 216; 711/108, 216, 202, 203, 711/220
See application file for complete search history.

(56) References Cited

U.S. PATENT DOCUMENTS

| | | | | | |
|---|---|---|---|---|---|
| 6,061,712 | A | * | 5/2000 | Tzeng | ..................... H04L 45/00 370/392 |
| 6,631,419 | B1 | * | 10/2003 | Greene | ................... H04L 45/54 370/392 |
| 6,662,184 | B1 | * | 12/2003 | Friedberg | .......... G06F 17/30625 707/754 |
| 6,735,670 | B1 | * | 5/2004 | Bronstein | ............. H04L 45/745 365/49.1 |

(Continued)

OTHER PUBLICATIONS

Kunihiko Sadakane et al., "Improving the Speed of LZ77 Compression by Hashing and Suffix Sorting", IEICE Trans. Fundamentals, vol. 83-A, No. 12, Dec. 2000 (10 pages).

(Continued)

*Primary Examiner* — Linh Nguyen
(74) *Attorney, Agent, or Firm* — Hanley, Flight & Zimmerman, LLC

(57) ABSTRACT

Example data compression methods disclosed herein include determining a hash chain index corresponding to a first position in an input data buffer based on a group of bytes beginning at a look-ahead offset from the first position. Such disclosed example methods also include, when a hash chain, which is indexed by the hash chain index, satisfies a quality condition, searching the input data buffer at respective adjusted buffer positions corresponding to a set of buffer positions stored in the hash chain being offset by the look-ahead offset to find a second data string matching a first data string beginning at the first position in the input data buffer. Such disclosed example methods further include, when the second data string satisfies a length condition, providing a relative position and a length of the second data string to an encoder to output compressed data corresponding to the input data buffer.

25 Claims, 9 Drawing Sheets

(56) References Cited

U.S. PATENT DOCUMENTS

| | | | | |
|---|---|---|---|---|
| 7,403,137 | B1* | 7/2008 | Huang | H03M 7/30 |
| | | | | 341/106 |
| 8,766,827 | B1* | 7/2014 | Milne | H03M 7/3084 |
| | | | | 341/51 |
| 8,804,950 | B1* | 8/2014 | Panwar | H04L 9/06 |
| | | | | 380/28 |
| 8,880,507 | B2* | 11/2014 | Kotha | G06F 17/30625 |
| | | | | 707/715 |
| 9,280,609 | B2* | 3/2016 | Liu | G06F 17/30949 |
| 2001/0043602 | A1* | 11/2001 | Brown | G06F 17/30955 |
| | | | | 370/392 |
| 2002/0196166 | A1 | 12/2002 | Satoh et al. | |
| 2003/0102989 | A1 | 6/2003 | Satoh | |
| 2004/0236720 | A1* | 11/2004 | Basso | G06F 17/30985 |
| 2006/0106870 | A1 | 5/2006 | Franaszek et al. | |
| 2006/0184556 | A1* | 8/2006 | Tan | G06F 17/30949 |
| 2007/0234005 | A1* | 10/2007 | Erlingsson | G06F 17/30949 |
| | | | | 711/216 |
| 2007/0279261 | A1 | 12/2007 | Todorov et al. | |
| 2009/0097654 | A1 | 4/2009 | Blake | |
| 2014/0223029 | A1* | 8/2014 | Bhaskar | H03M 7/3088 |
| | | | | 709/247 |

OTHER PUBLICATIONS

David A. Huffman, "A Method for the Construction of Minimum-Redundancy Codes", Proceedings of the I.R.E, Sep. 1952 (pp. 1098-1101).

P. Deutsch, "RFC 1951—DEFLATE Compressed Data Format Specification", Version 1.3, May 1996 (15 pages).

Ziv, Jacob, et al. "A Universal Algorithm for Sequential Data Compression", IEEE Transactions on Information Theory, vol. IT-23, No. 3, May 1977 (7 pages).

International Searching Authority, "International Search Report and Written Opinion", issued in connection with International Patent Application Serial No. PCT/US2016/047856, dated Nov. 21, 2016 (10 pages).

* cited by examiner

600 →

```
604:    // Let N be the current position in the input buffer in[]
608:    M = 0 // initialize amount of look-ahead for good chain
612:    Idx = hash(in[N:N+B-1])
616:    while (bad-chain(Idx)){
620:        M++;
624:        Idx = hash(in[M+N:M+N+B-1])
628:    }
632:    Get list of positions to search {P1, P2, ...} = walk-chain(Idx)
636:    Adjust each position in list as Pi = Pi – M
640:    Find the longest string from list of positions that matches string at in[N]
            with length L
644:    If L >= M+B then return match of length L for position N with relative offset N – Pi
648:    Else {
652:        If (M ==0) return no match exists for position N of input buffer
656:        Else { // default back to hash chain with no look-ahead
660:            Idx = hash(in[N:N+B-1])
664:            Get list of positions to search {P1, P2, ...} = walk-chain(Idx)
668:            Prune list to a subset of most-recent positions, e.g. {P1,...P8}
672:            Search for a string of length (B) to (M+B-1) from list of positions that
                    matches string at in[N]
676:            If match found, then return match of length L
                    (e.g., L= (B) to (M+B-1)) for position N with
                    relative offset N – Pi
680:            Else return no match exists for position N of input buffer
685:        }
690: }
```

FIG. 6

LOOK-AHEAD HASH CHAIN MATCHING FOR DATA COMPRESSION

FIELD OF THE DISCLOSURE

This disclosure relates generally to data compression and, more particularly, to look-ahead hash chain matching for data compression.

BACKGROUND

Many data compressors, such as those based on the LZ77 compression algorithm, perform data compression by replacing repeated data strings in an input data buffer with pointers to prior positions of the repeated strings in the input data buffer. Data compression is achievable because the pointers are typically smaller than the repeated data strings they replace. To find the repeated data strings in an input data buffer, some implementations of such data compressors utilize hash chain matching. In hash chain matching, a hash table is constructed with each entry corresponding to a respective data substring that was found previously in the input data buffer. Each entry of the hash table points to a respective hash chain storing the one or more positions in the input data buffer at which the particular data substring corresponding to the respective hash table entry was found. Data compressors can utilize such hash chains to limit the number of prior positions in the input data buffer to be searched when attempting to find a prior data string that matches and, thus, repeats a current data string beginning at the current position of the input data buffer undergoing compression.

BRIEF DESCRIPTION OF THE DRAWINGS

FIG. 6 illustrates example pseudocode corresponding to at least portions of the example flowchart of FIGS. 5A-5B.

The figures are not to scale. Wherever possible, the same reference numbers will be used throughout the drawing(s) and accompanying written description to refer to the same or like parts, elements, etc.

DETAILED DESCRIPTION

Figure 1:
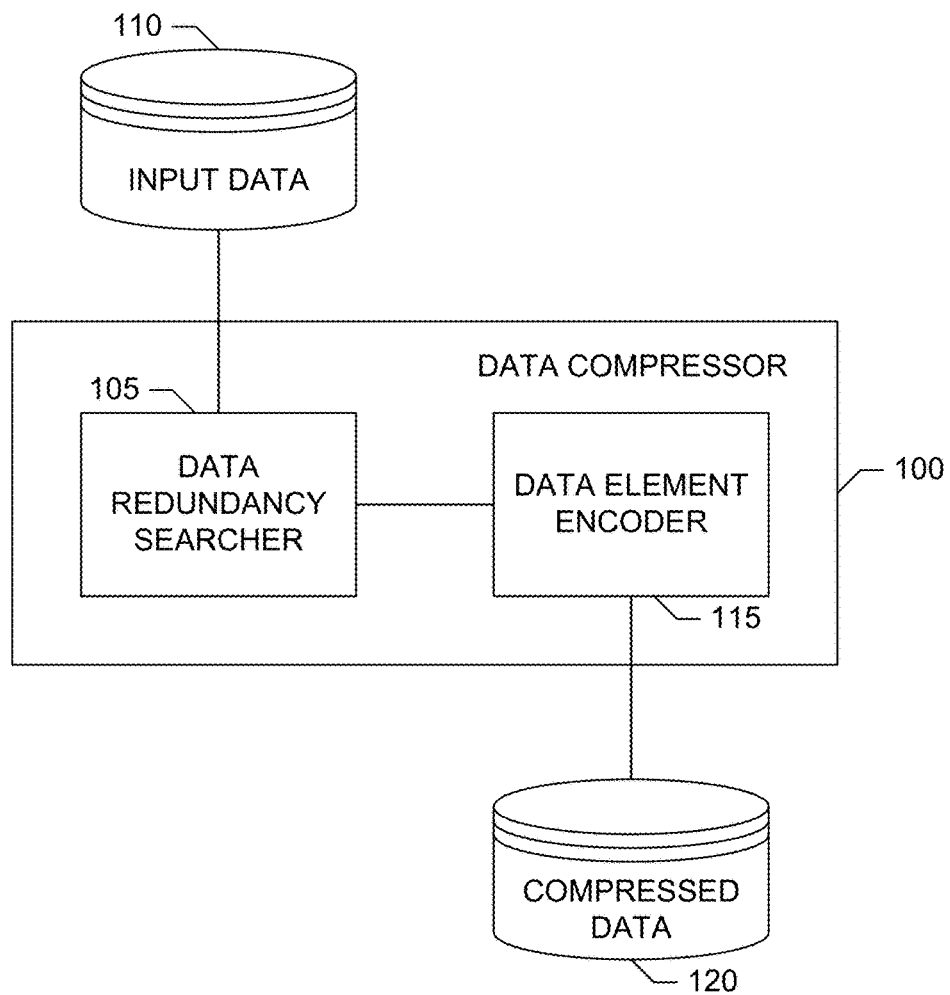
FIG. 1 is a block diagram of an example data compressor including an example data redundancy searcher constructed to perform look-ahead hash chain matching for data compression in accordance with the teachings of this disclosure.

Methods, apparatus, systems and articles of manufacture (e.g., physical storage media) to implement look-ahead hash chain matching for data compression are disclosed herein. Example data compression methods disclosed herein include determining a first hash chain index corresponding to a first position in an input data buffer based on a first group of bytes accessed from the input data buffer beginning at a first look-ahead offset from the first position. Such disclosed example methods also include, in response to determining a first hash chain, which is indexed in memory by the first hash chain index, satisfies a quality condition, searching the input data buffer at respective adjusted buffer positions corresponding to ones of a first set of buffer positions stored in the first hash chain being offset by the first look-ahead offset to find a second string of data bytes matching a first string of data bytes beginning at the first position in the input data buffer. Such disclosed example methods further include, in response to determining the second string of data bytes satisfies a length condition, providing a relative position and a length of the second string of data bytes to an encoder to output compressed data corresponding to the input data buffer.

In some disclosed example methods, the first group of bytes includes a first number of bytes beginning at the first look-ahead offset from the first position. In some such disclosed example methods, the determining of the first hash chain index includes processing the first group of bytes with a hash function to determine the first hash chain index.

Additionally or alternatively, in some disclosed example methods, the first hash chain is determined to satisfy the quality condition when at least one of (i) the first hash chain index is not included in a blacklist of hash chain indices, or (ii) a number of buffer positions stored in the first hash chain satisfies a threshold.

Additionally or alternatively, some disclosed example methods further include subtracting the first look-ahead offset from the ones of the first set of buffer positions stored in the first hash chain to determine the respective adjusted buffer positions.

Additionally or alternatively, in some disclosed example methods, the second string of data bytes satisfies the length condition when the length of the second string of data bytes is greater than or equal to a sum of the first look-ahead offset and a number corresponding to a number of bytes included in the first group of bytes.

Additionally or alternatively, in some disclosed example methods, the length condition is a first length condition. Some such disclosed example methods include, when the first hash chain does not satisfy the quality condition, determining a second hash chain index corresponding to the first position in the input data buffer based on a second group of bytes accessed from the input data buffer beginning at a second look-ahead offset from the first position, with the second look-ahead offset being larger than the first look-ahead offset. Such disclosed example methods also include, in response to determining a second hash chain, which is indexed in memory by the second hash chain index, satisfies the quality condition, searching the input data buffer at respective adjusted buffer positions corresponding to ones of a second set of buffer positions stored in the second hash chain being offset by the second look-ahead offset to find a fourth string of data bytes matching a third string of data bytes beginning at the first position in the input data buffer. Such disclosed example methods further include, in response to determining the fourth string of data bytes satisfies a second length condition, providing a relative position and a length of the fourth string of data bytes to an encoder to output the compressed data corresponding to the input data buffer. In some such examples, the second string of data bytes satisfies the first length condition when the length of the second string of data bytes is greater than or equal to a sum of the first look-ahead offset and a number, the fourth string of data bytes satisfies the second length condition when the length of the fourth string of data bytes is greater than or equal to a sum of the second look-ahead offset and the number, and the number corresponds to a number of bytes included in the first group of bytes and a number of bytes included in the second group of bytes.

Additionally or alternatively, some disclosed example methods include, when the second string of data bytes does not satisfy the first length condition, determining a third hash chain index corresponding to the first position in the input data buffer based on a third group of bytes accessed from the input data buffer beginning at the first position in the input data buffer. Such disclosed example methods also include searching the input data buffer at respective ones of a subset of a third set of buffer positions stored in a third hash chain, which is indexed in memory by the third hash chain index, to find a sixth string of data bytes matching a fifth string of data bytes beginning at the first position in the input data buffer. Such disclosed example methods further include, in response to determining the sixth string of data bytes satisfies a third length condition, providing a relative position and a length of the sixth string of data bytes to an encoder to output the compressed data corresponding to the input data buffer. In some such examples, the sixth string of data bytes satisfies the third length condition when the length of the sixth string of data bytes is between a first number corresponding to a number of bytes included in the third group of bytes and a second number equal to one less than a sum of the first look-ahead offset and the number of bytes included in the third group of bytes. Additionally or alternatively, in some such examples, the subset of the third set of buffer positions stored in the third hash chain corresponds to a first number of buffer positions stored at the beginning of the third hash chain.

These and other example methods, apparatus, systems and articles of manufacture (e.g., physical storage media) to implement look-ahead hash chain matching for data compression are disclosed in greater detail below.

As noted above, many data compressors perform data compression by replacing repeated data strings in an input data buffer with one version of the data string and pointers to prior positions of the other repeated strings in the input data buffer. Some such data compressors further utilize hash chain matching to reduce the number of prior positions in the input data buffer to be searched when attempting to find a prior data string that matches and, thus, repeats a current data string beginning at a current position of the input data buffer undergoing compression. However, string searching based on hash chain matching can still be time consuming if a particular hash chain to be searched is long, which can occur for hash chains corresponding to data substrings that are popular or otherwise likely to occur repeatedly in the input data buffer. Prior data compressors typically do not provide any mechanism to avoid searching such long or, in other words, bad hash chains.

Example methods, apparatus, systems and articles of manufacture (e.g., physical storage media) disclosed herein implement look-ahead hash chain matching for data compression, which provides technical solutions to the technical problems associated with the searching of bad hash chains that plague prior data compressors. When attempting to find a prior data string that matches a current data string beginning at a current position of the input data buffer undergoing compression, prior data compressors are unable to avoid searching bad hash chains. This is because the prior data compressors are limited to using a substring formed from a group of data bytes beginning at the current input buffer position to select the hash chain to be searched. Unlike such prior data compressors, disclosed example data compressors utilizing look-ahead hash chain matching are able to avoid searching bad hash chains by using a substring formed from a group of data bytes beginning at a look-ahead offset from the current position of the input data buffer to select the hash chain to be searched for finding a prior data string matching a current data string beginning at the current input buffer position.

As disclosed in further detail below, example data compressors utilizing look-ahead hash chain matching as disclosed herein are able to adjust the look-ahead offset until the hash chain index formed from the group of data bytes beginning at the look-ahead offset from the current input buffer position corresponds to a hash chain that is not a bad hash chain. Examples of distinguishing between good and bad hash chains are disclosed in further detail below. However, the resulting hash chain indexed by this look-ahead hash chain index does not correspond to the group of data bytes beginning at the current input buffer position but, instead, corresponds to the group of data bytes beginning at the look-ahead offset from the current input buffer position. Accordingly, example data compressors utilizing look-ahead hash chain matching as disclosed herein adjust the buffer positions stored in the selected hash chain by the look-ahead offset, as disclosed in further detail below, to determine the input buffer positions to be searched for a prior data string (e.g., a longest prior data string) matching a current data string beginning at the current input buffer position undergoing compression. By avoiding searching potentially bad hash chains, example data compressors utilizing look-ahead hash chain matching as disclosed herein can achieve substantial reductions in processor cycles and/or substantial increases in data throughput relative to prior data compressors.

Turning to the figures, a block diagram of an example data compressor 100 including an example data redundancy searcher 105 constructed to perform look-ahead hash chain matching for data compression in accordance with the teachings of this disclosure is illustrated in FIG. 1. The example data compressor 100 of FIG. 1 implements data compression, such as any data compression algorithm based on LZ77 compression, by searching for and replacing repeated data strings in an input data buffer with pointers to prior positions of the repeated strings in the input data buffer. For example, the structure of the example data compressor 100 of FIG. 1 is compatible with the DEFLATE compression algorithm as specified by the Internet Engineering Task Force (IETF) in RFC 1951. DEFLATE compression utilizes a combination of an LZ77 compression algorithm to find repeated strings in an input data buffer, and Huffman coding to code the data elements output by the LZ77 compression algorithm.

Accordingly, the example data compressor 100 of FIG. 1 includes the example data redundancy searcher 105 to search for and replace repeated data strings in an example input data buffer 110 with pointers to prior positions of the repeated strings in the input data buffer 110. As such, in some examples, the data redundancy searcher 105 can be used to implement the LZ77 compression portion of the DEFLATE compression algorithm. In the illustrated example of FIG. 1, the data compressor 100 also includes an example data element encoder 115 to encode the data elements determined by the example data redundancy searcher 105 for outputting to an example compressed data buffer 120 corresponding to the example input data buffer 110. As such, in some examples, the data element encoder 115 can be used to implement the Huffman coding portion of the DEFLATE compression algorithm.

As noted above, the data redundancy searcher 105 searches for repeated data strings in the input data buffer 110 and replaces the repeated strings with pointers to prior positions of the repeated strings in the input data buffer 110. In some examples, a given pointer for a given repeated data string corresponding to a current string at the current input buffer position being compressed includes a length of the repeated data string and a relative position (e.g., a relative, backwards distance or offset) from the current input buffer position back to the starting point of the repeated data string in the input data buffer 110. Thus, the pointer to the given repeated data string may be represented as a data pair <length, relative position>. The DEFLATE compression algorithm restricts the relative positions to be no more than 32 Kbytes, and the lengths to be no more than 258 bytes.

If the data redundancy searcher 105 of the illustrated example finds a prior repeated data string for the current input buffer position, the data redundancy searcher 105 outputs the pointer (e.g., the data pair <length, relative position>) for the repeated data string and then advances the current position of the input buffer that is to undergo compression by the length of the repeated data string. However, if the data redundancy searcher 105 of the illustrated example does not find a repeated prior data string for the current input buffer position, the data redundancy searcher 105 outputs one or more literal bytes containing the actual byte(s) of data at the current input buffer position being compressed, and advances the current position of the input buffer that is to undergo compression by the number of literal bytes that were output (e.g., by 1 or some other value).

Thus, the data elements output by the example data redundancy searcher 105 of FIG. 1 include (i) literal bytes and (ii) pointers (e.g., data pairs having the form <length, relative position>) for repeated data strings. The example data element encoder 115 of FIG. 1 encodes the literal bytes and repeated string pointers output by the data redundancy searcher 105 for inclusion in the output compressed data buffer 120 corresponding to the input data buffer 110. For example, to implement the DEFLATE compression algorithm, the data element encoder 115 can encode the data elements (e.g., the literal bytes and repeated string pointers) output by the data redundancy searcher 105 using Huffman coding to further reduce the size of the output compressed data buffer 120 (e.g., in addition to the data size reduction achieved by the repeated string matching and replacement performed by the data redundancy searcher 105).

In the illustrated example of FIG. 1, the data redundancy searcher 105 maintains a hash chain data structure to facilitate searching for repeated data strings in the input data buffer 110. In some examples, the hash chain data structure maintained by the data redundancy searcher 105 includes respective hash chains storing the prior positions in the input data buffer 110 for each three (3) byte substring found in the input data buffer 110. In some examples, each 3-byte substring found in the input data buffer 110 forms a 3-byte prefix that is used to index into a hash table containing pointers to the respective hash chains being maintained by the data redundancy searcher 105. Although 3-byte substrings/prefixes are utilized by the data redundancy searcher 105 of the illustrated example, substrings/prefixes of any length (e.g., 2 bytes, 4 bytes, etc.) could alternatively be used.

Figure 7:
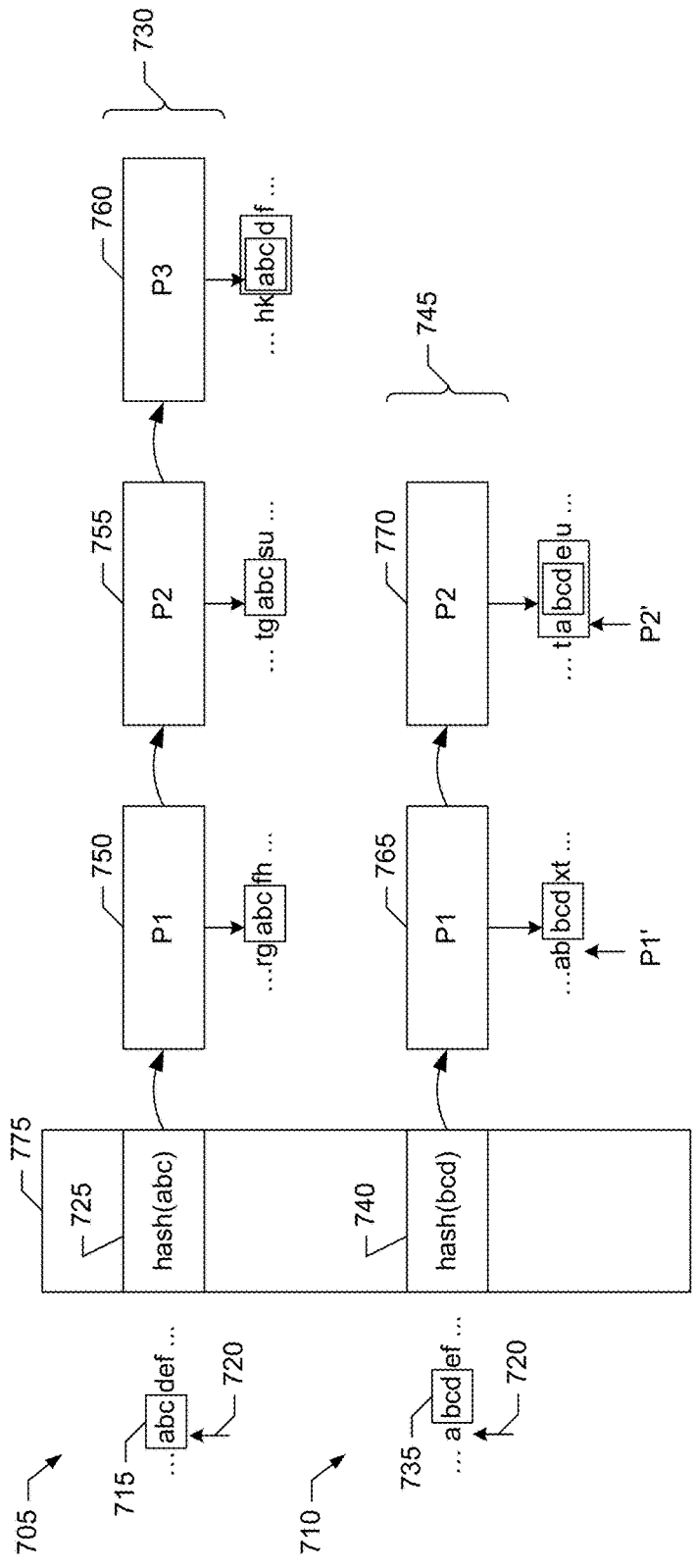
FIG. 7 illustrates example look-ahead hash chain matching operations capable of being performed by the example data redundancy searchers of FIGS. 1 and/or 2.

For example, the hash chain data structure maintained by the data redundancy searcher 105 can include a hash table storing a set of hash chain indices corresponding to the 3-byte substrings/prefixes currently found in the input data buffer 110. To reduce the size of the hash table, in some examples, the 3-byte substrings/prefixes are hashed with a hashing function to reduce the size of the hash chain indices from 3×8=24 bits to a fewer number of bits (e.g., 8 bits, 10 bits, 12 bits, or some other value), thereby reducing the size of the hash table to be maintained by the data redundancy searcher 105. For each hash chain index stored in the hash table, the hash table also includes a pointer, in memory, to the corresponding hash chain, which is indexed by that hash chain index. The hash chain indexed by a given hash chain index represents a history buffer of the locations in the input data buffer 110 of the 3-byte substring/prefix corresponding to the given hash chain index. In some examples, the hash chains are implemented by linked lists or any other appropriate data structure. An example hash chain data structure capable of being maintained by the example data redundancy searcher 105 is illustrated in FIG. 7, which is described in further detail below.

In prior hash chain matching implementations, hash chain processing proceeds as follows. When performing compression of data beginning at the current input buffer position, a prior data compressor accesses the next 3-byte substring/prefix beginning at the current input buffer position, hashes the 3-byte substring/prefix to obtain the corresponding hash chain index, and accesses the particular hash chain indexed by that hash chain index. Then, the prior data compressor searches the input data buffer at the prior positions stored in the hash chain to find the longest prior string that matches a data string beginning at the current input buffer position (and, thus, starting with the 3-byte substring/prefix corresponding to the selected hash chain). However, as noted above, some hash chains may be bad hash chains or, in other words, hash chains that are prone to be long. Longer hash chains take longer to process than shorter hash chains. As such, prior compression techniques attempt to reduce the length of hash chains by, for example, specifying a maximum hash chain length (e.g., 4, 8, 16, 32, 128, 256, 1024, 4096, etc., or some other number of entries) and/or specifying a threshold matching string length (e.g., 8, 16, 32, 128, 258, etc., or some other number of bytes) which, if met, terminates processing of the hash chain. Although such prior techniques can reduce the impact of a bad chain on compression processing, such techniques do not provide a mechanism to avoid bad hash chains altogether.

In contrast with such prior hash chain matching implementations, the data redundancy searcher 105 of the illustrated example implements look-ahead hash chain matching in accordance with the teachings of this disclosure. Look-ahead hash chain matching, as disclosed herein, avoids bad hash chains by "looking-ahead" from the current input buffer position undergoing compression by a look-ahead offset to find a 3-byte substring/prefix that does not correspond to a bad hash chain. Once a look-ahead offset yielding an acceptable hash chain is identified, the data redundancy searcher 105 searches the input data buffer 110 at the prior positions stored in the selected hash chain, after adjusting the stored buffer positions to compensate for the look-ahead offset, to find the longest repeated data string matching a string beginning at the current input buffer position. In some examples, if an acceptable hash chain is not identified, the data redundancy searcher 105 defaults to searching the hash chain corresponding to a look-ahead offset of 0 (or, in other words, corresponding to no look-ahead offset).

By way of example, consider a scenario in which the input data buffer 110 corresponds to English text. In English text, words such as "the" and "and" occur frequently. As such, the 3-byte substrings/prefixes "_th", "the", "he_", "_an", "and" and "nd_" (where "_" represents a space) may appear many times in the input data buffer 110. Accordingly, the hash chains corresponding to these 3-byte substrings/prefixes are likely to be long and, thus, are considered to correspond to bad chains in this example.

Next, assume that, in this example, the current input buffer position undergoing compression begins with the string "_them_". Prior hash chain matching implementations would simply use the initial 3-byte substring/prefix, namely, "_th", and search the buffer positions stored in the hash chain for this 3-byte substring/prefix to find the longest prior repeated data string matching a string beginning at the current input buffer position. However, "_th" is associated with a bad hash chain and, thus, may be time consuming to process.

In contrast with such prior hash chain matching implementations, the data redundancy searcher 105 implements look-ahead hash chain matching to avoid this bad hash chain. For example, the data redundancy searcher 105 continues to look-ahead from the current input buffer position by a look-ahead offset to find a 3-byte substring/prefix corresponding to a hash chain that is not a bad hash chain. In the preceding example, the data redundancy searcher 105 could use a look-ahead offset of 2 bytes to select the 3-byte substring/prefix "hem", instead of the 3-byte substrings/prefixes "_th" or "the", for hash chain matching. However, the prior positions stored in the selected hash chain point to locations where strings starting with "hem" are located in the input data buffer 110. To properly compare the data string beginning at the current input buffer position with the data strings located at the prior positions stored in the selected hash chain, the data redundancy searcher 105 adjusts the stored positions by the look-ahead offset (e.g., by subtracting two bytes from each of the stored positions, in this example) such that the adjusted buffer positions point to locations where strings of the form "**hem" are located in the input data buffer 110 (where "*" refers to an unknown data value), which are aligned with the input string "_them" corresponding to the current input buffer position.

In such an example, the data redundancy searcher 105 searches the adjusted buffer positions determined for the hash chain corresponding to the 3-byte substring/prefix "hem" to find the longest prior repeated data string matching a data string beginning at the current input buffer position. Notably, in this example, the length of the matching prior repeated data string can be no fewer than 5 bytes, which corresponds to the length of the substring/prefix (e.g., 3 bytes in this example) used to index the hash chain, plus the look-ahead offset (e.g., 2 bytes in this example) used to skip ahead to the acceptable hash chain.

More generally, the example data redundancy searcher 105 performs look-ahead hash chain matching for data compression as follows. To find a prior repeated data string (e.g., a longest, prior repeated data string) matching a string beginning at the current input buffer position, the data redundancy searcher 105 uses the 3-byte substring/prefix beginning at the current input buffer position to generate a hash chain index, which is used to select the particular hash chain to be searched. This hash chain is referred to herein as "chain0" as it corresponds to a look-ahead offset equal to 0.

If the example data redundancy searcher 105 determines that chain0 corresponds to a bad chain (e.g., based on a blacklist, a chain size, etc., as described in further detail below), the data redundancy searcher 105 increments the look-ahead offset by, for example, 1 position (e.g., 1 byte). The example data redundancy searcher 105 then uses the 3-byte substring/prefix beginning at this look-ahead offset from the current input buffer position to generate a new hash chain index, which is used to select another hash chain to be searched. This hash chain is referred to herein as "chain1" as it corresponds to a look-ahead offset equal to 1. If the example data redundancy searcher 105 determines that chain1 does not correspond to a bad chain (or, in other words, corresponds to a good chain), the data redundancy searcher 105 searches the input data buffer 110 at the prior positions stored in chain1, after adjusting the stored positions by the look-ahead offset (e.g., by subtracting 1 byte from each prior position), to find a repeated data string having a length of at least 4 bytes (e.g., corresponding to the substring/prefix size plus the look-ahead offset) that matches a data string beginning at the current input buffer position. In some examples, the data redundancy searcher 105 searches the input data buffer 110 at the adjusted prior positions from chain1 to find the longest matching prior string. In some examples, the data redundancy searcher 105 searches the input data buffer 110 at the adjusted prior positions from chain1 to find the first matching prior string having a length of at least 4 bytes. In some examples, the data redundancy searcher 105 searches the input data buffer 110 at a first subset (e.g., a specified maximum number) of the adjusted prior positions from chain1 to find the longest matching prior string having a length of at least 4 bytes from among that subset of prior positions stored in chain1.

In some examples, if the data redundancy searcher 105 does not find a repeated data string having a length of at least 4 bytes after searching the adjusted prior positions from chain1, the data redundancy searcher 105 reverts to searches the input data buffer 110 at the prior positions stored in chain 0. However, in such examples, the data redundancy searcher 105 can stop searching after finding the first repeated data string having a length of 3 bytes, as there are no matching repeated data strings having a length of 4 or more bytes because the search associated with chain1 was unsuccessful. Because of this, in some examples, the data redundancy searcher 105 limits its search of chain 0 to just a subset of the prior positions (e.g., such as the first 4 positions, the first 8 positions, etc.) stored in chain0).

In some examples, if the example data redundancy searcher 105 determines that chain1 corresponds to a bad chain (e.g., based on a blacklist, a chain size, etc., as described in further detail below), the data redundancy searcher 105 again increments the look-ahead offset by, for example, 1 position (e.g., 1 byte), such that the look-ahead offset is now 2 bytes. The example data redundancy searcher 105 then uses the 3-byte substring/prefix beginning at this look-ahead offset from the current input buffer position to generate a new hash chain index, which is used to select another hash chain to be searched. This hash chain is referred to herein as "chain2" as it corresponds to a look-ahead offset equal to 2. If the example data redundancy searcher 105 determines that chain2 does not correspond to a bad chain (or, in other words, corresponds to a good chain), the data redundancy searcher 105 searches the input data buffer 110 at the prior positions stored in chain 2, after adjusting the stored positions by the look-ahead offset (e.g., by subtracting 2 bytes from each prior position), to find a repeated data string having a length of at least 5 bytes (e.g., corresponding to the substring/prefix size plus the look-ahead offset) that matches a data string beginning at the current input buffer position. However, if the example data redundancy searcher 105 determines that chain2 corresponds to a bad chain, the example data redundancy searcher 105 again increments the look-ahead offset by, for example, 1 position (e.g., 1 byte), such that the look-ahead offset is 3 bytes, and repeats the foregoing process.

In some examples, the example data redundancy searcher 105 continues to increment the look-ahead offset until a good hash chain is indexed by the substring/prefix at the look-ahead offset from the current input buffer position, or a threshold (e.g., maximum) look-ahead offset is reached. In some examples, if a matching repeated data string is not found in the input data buffer 110 at the prior positions (after adjustment by the look-ahead offset) stored in a good hash chain, or the threshold (e.g., maximum) look-ahead offset is reached, the example data redundancy searcher 105 defaults to decrementing the look-ahead offset by, for example, 1 position and searching the hash chain corresponding to the decremented look-ahead offset, even though that hash chain was determined to be a bad hash chain previously. Thus, in such examples, the data redundancy searcher 105 defaults to processing bad hash chains only after exhausting its attempts to search a good hash chain for a matching prior repeated data string. In some examples, if a matching repeated data string is still not found at the prior positions (after adjustment by the look-ahead offset) stored in the hash chain corresponding to the decremented look-ahead offset, the example data redundancy searcher 105 repeats the foregoing process of decrementing the look-ahead offset until the matching repeated data string is found, or the look-ahead offset returns to zero. Then, if a matching repeated data string is still not found at the prior positions of the input data buffer 110 stored in the hash chain corresponding to a look-ahead offset of 0 (e.g., chain0), the example data redundancy searcher 105 determines the a matching repeated data string corresponding to a string beginning at the current input buffer position does not exist.

The example data compressor 100 of FIG. 1 is structured to process any type of input data. Accordingly, the example input data buffer 110 employs any appropriate data structure(s), data format(s), etc., to store any one or more types of input data to be compressed, such as, for example, text (e.g., alphanumeric) data (e.g., corresponding to any language), multimedia data (e.g., audio data, video data, image data, etc.), binary data (e.g., corresponding to any file format), etc. In the illustrated example, the example compressed data buffer 120 employs any appropriate data structure(s), data format(s), etc., to store compressed data corresponding to the type(s) of input data stored in the input data buffer 110. The example input data buffer 110 and/or the example compressed data buffer 120 can be stored in any type(s) and/or number of memories, storage devices, etc., such as the example mass storage device 828 and/or the example volatile memory 814 in the example processor platform 800 of FIG. 8, which is described in further detail below.

In some examples, the data compressor 100 of FIG. 1 is implemented as a stand-alone data compression device (e.g., for inclusion in a data transmission system, such as a video transmission system, a wireless data transmission system, etc.) In some examples, the data compressor 100 of FIG. 1 is integrated into another device, system, etc. (e.g., such as a web server, a mobile device, a personal computer, a computer processor, etc.).

Although the illustrated example data compressor 100 of FIG. 1 is described from the perspective of implementing the DEFLATE compression algorithm, look-ahead hash chain matching for data compression as disclosed herein is not limited thereto. On the contrary, look-ahead hash chain matching for data compression, as disclosed herein, can be used with any compression algorithm that searches the input data being compressed for matching prior repeated data strings. As such, the example data compressor 100 of FIG. 1 can be used to implement other compression algorithms in addition to, or as an alternative to, the DEFLATE compression algorithm. Examples of such data compression algorithms include, but are not limited to, LZ77, LZO, LZF, LZ4, QuickLZ, FastLZ, Google's® Snappy algorithm, etc.

Figure 2:
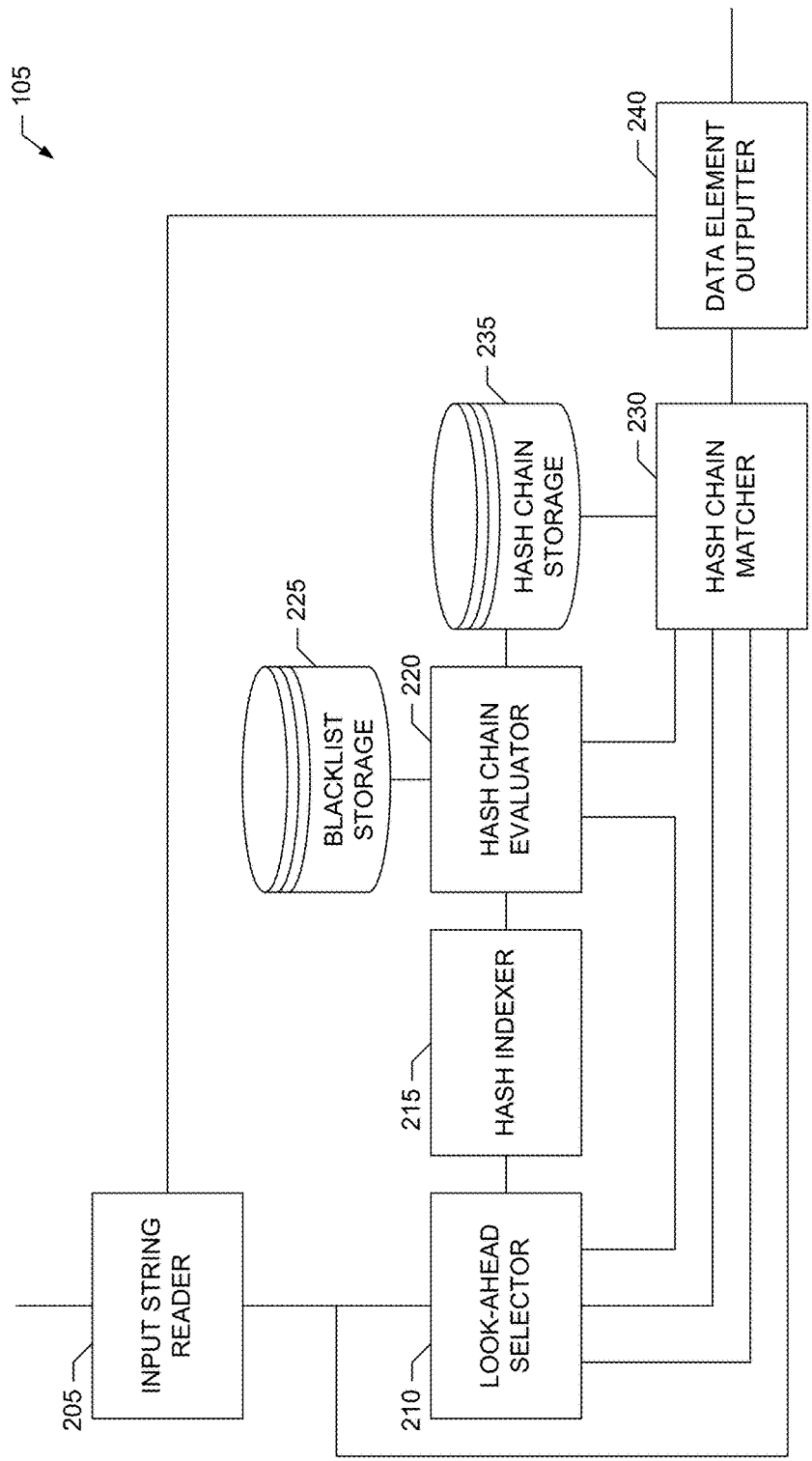
FIG. 2 is a block diagram of an example implementation of the example data redundancy searcher of FIG. 1.

A block diagram illustrating an example implementation of the data redundancy searcher 105 of FIG. 1 is illustrated in FIG. 2. Operation of the example data redundancy searcher 105 of FIG. 2 is illustrated by way of example in FIG. 7. The example data redundancy searcher 105 of FIG. 2 includes an example input string reader 205 to access the example input data buffer 110 and read data strings beginning at a current input buffer position maintained by the input string reader 205. For example, the input string reader 205 may be structured to read data formatted as 1 byte (8 bit) chunks corresponding to alphanumeric characters, and/or formatted into smaller chunks, larger chunks, etc. After a compression cycle, the input string reader 205 of the illustrated example is responsible for incrementing the current input buffer position (e.g., by the length of the matching prior repeated string or by the number of literals output if no matching string is found) to the next input buffer position to undergo compression.

The example data redundancy searcher 105 of FIG. 2 also includes an example look-ahead selector 210 to select the look-ahead offset to be used by the data redundancy searcher 105 to select the hash chain to be searched for a prior repeated data string that matches a data string beginning at the current input buffer position. In some examples, the look-ahead selector 210 begins with a look-ahead offset of 0, and increments the look-ahead offset until a hash index formed from a substring/prefix beginning at the look-ahead offset from the current input buffer position indexes (e.g., points to) a good hash chain, or a threshold (e.g., maximum) look-ahead offset is reached. In some examples, if a good hash chain is not found (e.g., when the threshold look-ahead offset is reached), or a search of the input data buffer 110 at the positions stored in a selected good hash chain (after adjustment by the look-ahead offset) does not yield a matching prior repeated data string, the example look-ahead selector 210 then decrements the look-ahead offset to select a substring/prefix beginning at the decremented look-ahead offset from the current input buffer position. In some such examples, the look-ahead selector 210 continues decrementing the look-ahead offset until a search of the input data buffer 110 at the positions stored in a hash chain corresponding to the look-ahead offset (after adjustment by the look-ahead offset) yields a matching prior repeated data string, or until the look-ahead offset equals 0.

The example data redundancy searcher 105 of FIG. 2 further includes an example hash indexer 215 to generate a hash chain index from a substring/prefix of the input data stored in the input data buffer 110. In the illustrated example of FIG. 2, the hash indexer 215 generates a hash chain index corresponding to the current input buffer position undergoing compression by accessing a substring/prefix of data bytes (e.g., 3 bytes or some other number of bytes) beginning at the currently selected look-ahead offset (e.g., as selected by the example look-ahead selector 210) from the current input buffer position in the input data buffer 110. In some examples, the hash indexer 215 further hashes the accessed substring/prefix of data bytes to form a hash chain index to be used to select the hash chain to be searched. In such examples, the hash indexer 215 can implement any appropriate hash function capable of reducing the size of a hash chain index relative to the size of a corresponding input substring/prefix.

For example, FIG. 7 illustrates operation of the data redundancy searcher 105 of FIG. 2 during two example compression processing cycles 705 and 710. In the first example compression processing cycle 705, the look-ahead offset selected by the example look-ahead selector 210 corresponds to a value of 0 and, thus, there is no look-ahead offset. Thus, the hash indexer 215 accesses an example substring/prefix 715 beginning at the current input buffer position 720 and hashes this substring/prefix 715 to determine a first example hash chain index 725, which indexes a first example hash chain 730. In the second example compression processing cycle 710, the look-ahead offset selected by the example look-ahead selector 210 corresponds to a value of 1 (e.g., corresponding to 1 byte). Thus, the hash indexer 215 accesses an example substring/prefix 735 beginning at the look-ahead offset of 1 position from the current input buffer position 720, and hashes this substring/prefix 735 to determine a second example hash chain index 740, which indexes a second example hash chain 745.

Returning to FIG. 2, to evaluate whether a hash chain indexed by a particular hash chain index determined by the example hash indexer 215 is a bad chain, the illustrated example data redundancy searcher 105 includes an example hash chain evaluator 220. In the illustrated example of FIG. 2, the hash chain evaluator 220 determines whether the hash chain indexed by the particular hash chain index determined by the example hash indexer 215 is a bad chain by evaluating whether the indexed hash chain satisfies one or more quality conditions.

In some examples, the hash chain evaluator 220 determines that the quality condition is satisfied for a particular hash chain being evaluated when the input substring/prefix used to generate the hash chain index indexing the hash chain does not appear in a blacklist. In some such examples, the data redundancy searcher 105 includes an example blacklist storage 225 to store a list (e.g., the blacklist) of substrings/prefixes that are likely to correspond to long hash chains for the type of data undergoing compression. For example, if the type of data stored in the input data buffer 110 undergoing compression is expected to be English text data, the blacklist stored in the example blacklist storage 225 can be constructed to include substrings/prefixes that commonly occur in the English language, such as "_th", "the", "he_", "_an", "and" and "nd_", etc. (where "_" represents a space), as described above. As another example, if the type of data stored in the input data buffer 110 undergoing compression is expected to be data served by a website, the blacklist stored in the example blacklist storage 225 can be constructed to include substrings/prefixes that commonly occur in files served by that website (e.g., such as substrings/prefixes based on hypertext markup language (HTML) keywords, keywords used in multimedia file formats (e.g., MPEG, AC3, etc.) used to store multimedia data served by the website, etc.), etc. Because such substrings/prefixes commonly occur in the type of data to be stored in the input data buffer 110, such substrings/prefixes are likely to be associated with long hash chains and, thus, are classified as corresponding to bad hash chains.

In some examples, the blacklist stored in the blacklist storage 225 is constructed by processing sample training data to determine the substrings/prefixes that occur most frequently in the training data, which are then included in the blacklist. In some examples, the blacklist stored in the blacklist storage 225 is constructed from external reference sources (e.g., dictionaries) characterizing the frequency of occurrence of substrings/prefixes in the type of data expected to be stored in the input data buffer 110 for compression. In some examples, the blacklist storage 225 stores different blacklists corresponding to different types of data capable of being compressed by the example data compressor 100. In some such examples, the hash chain evaluator 220 selects the particular blacklist after determining (e.g., automatically, based on an input selection) the type of data stored in the input data buffer 110. The example blacklist storage 225 can be implemented by any type(s) and/or number of memories, storage devices, etc., such as the example mass storage device 828 and/or the example volatile memory 814 in the example processor platform 800 of FIG. 8, which is described in further detail below.

Additionally or alternatively, in some examples, the hash chain evaluator 220 determines that the quality condition is satisfied for a particular hash chain being evaluated when the number of input buffer positions stored in the hash chain satisfies a threshold. In some such examples, the hash chain evaluator 220 maintains respective counts of the buffer positions stored in the hash chains being maintained by the example data redundancy searcher 105. In such examples, the hash chain evaluator 220 determines that the quality condition is satisfied for a particular hash chain being evaluated when the count of the buffer positions stored in the hash chain does not exceed the threshold.

The example data redundancy searcher 105 of FIG. 2 also includes an example hash chain matcher 230 to search the positions stored in a particular hash chain indexed by the particular hash chain index determined by the example hash indexer 215 (and, in some examples, determined by the example hash chain evaluator 220 to be a good chain) to find a prior repeated data string that matches a data string beginning at the current input buffer position undergoing compression. If the particular hash chain to be searched corresponds to a non-zero look-ahead offset (e.g., as selected by the look-ahead selector 210), the example hash chain matcher 230 further adjusts the buffer positions stored in the particular hash chain to compensate for the non-zero look-ahead offset to search the input data buffer 110 for a matching repeated data string at the adjusted buffer positions. For example, the hash chain matcher 230 may subtract the look-ahead offset from the buffer positions stored in the indexed hash chain to determine the adjusted buffer positions at which the hash chain matcher 230 is to search the input data buffer 110 for a prior repeated data string that that matches a data string beginning at the current input buffer position.

For example, in the first example processing cycle 705 illustrated in FIG. 7, the hash chain matcher 230 searches the input data buffer 110 at the example positions P1, P2 and P3 stored in the respective example elements 750, 755 and 760 of the example hash chain 730 for a prior repeated data string matching a data string beginning at the current input buffer position 720 and starting with the substring/prefix "abc". As the example hash chain 730 corresponds to the hash chain indexed by the hash of the substring/prefix "abc", each of the positions P1, P2 and P3 stored in the respective example elements 750, 755 and 760 corresponds to an occurrence of the substring/prefix "abc" in the history of the input data buffer 110, as shown in the figure (assuming no hash collisions have occurred). In the first example processing cycle 705, after searching the input data buffer 110 at the example positions P1, P2 and P3 stored in the respective example elements 750, 755 and 760 of the example hash chain 730, the hash chain matcher 230 determines that longest matching repeated data string is "abcd" corresponding to the position P3 stored in the element 760 of the hash chain 730. In this example, the hash chain matcher 230 outputs the position P3 stored in the element 760 and the length of the matching repeated data string (e.g., a length of 4 bytes in this example) in response to finding a successful match. In some examples, the hash chain matcher 230 also updates the example hash chain 730 to add an element corresponding to the current input buffer position 720 because the substring/prefix "abc" is also located at that position in the input data buffer 110.

As another example, assume that the example hash chain evaluator 220 determines that the example hash chain 730 does not satisfy the evaluated quality condition(s) and, thus, is a bad hash chain. In this example, processing proceeds to the second example processing cycle 710 illustrated in FIG. 7, which corresponds to a look-ahead offset of 1 position. In the second example processing cycle 710, the hash chain matcher 230 searches the input data buffer 110 at the example positions P1 and P2 stored in the respective example elements 765 and 770 of the example hash chain 745 for a prior repeated data string matching a data string beginning at the current input buffer position 720 and starting with the substring/prefix "abc". However, because the example hash chain 745 corresponds to a look-ahead offset of 1 position, the example hash chain 745 corresponds to the hash chain indexed by the hash of the substring/prefix "bcd" in the illustrated example and, thus, each of the positions P1 and P2 stored in the respective example elements 765 and 770 corresponds to an occurrence of the substring/prefix "bcd" in the history of the input data buffer 110. As such, the example hash chain matcher 230 adjusts the positions P1 and P2 stored in the respective elements 765 and 770 of the hash chain 745 by the look-ahead offset, which is 1 position in this example, and searches the input buffer 110 at the respective adjusted positions P1' and P2', as shown in the figure. In the second example processing cycle 710, after searching the input data buffer 110 at the example adjusted positions P1' and P2' corresponding to the positions P1 and P2 stored in the respective example elements 765 and 770 of the example hash chain 745, the hash chain matcher 230 determines that longest matching repeated data string is "abcde" corresponding to the position P2'. In this example, the hash chain matcher 230 outputs the position P2' and the length of the matching repeated data string (e.g., a length of 5 bytes in this example) in response to finding a successful match. In some examples, the hash chain matcher 230 also updates the example hash chain 745 to add an element corresponding to the look-ahead offset from the current input buffer position 720 because the substring/prefix "bcd" is also located at that position in the input data buffer 110. In some examples, the hash chain matcher 230 further updates the example hash chain 730 to add an element corresponding to the current input buffer position 720 because the substring/prefix "abc" is also located at that position in the input data buffer 110.

Returning to FIG. 2, the data redundancy searcher 105 of the illustrated example includes an example hash chain storage 235 to store an example hash chain data structure including the hash chains to be accessed, searched and/or updated, as appropriate, by the example hash chain matcher 230. For example, with reference to FIG. 7, the example hash chain data structure stored in the example hash chain storage 235 can include an example hash table 775 storing the hash chain indices that index the different hash chains 730, 745, etc., as well as one or more linked lists implementing the different hash chains 730, 745, etc. The example hash chain storage 235 can be implemented by any type(s) and/or number of memories, storage devices, etc., such as the example mass storage device 828 and/or the example volatile memory 814 in the example processor platform 800 of FIG. 8, which is described in further detail below.

The example data redundancy searcher 105 of FIG. 2 also includes an example data element outputter 240 to output data elements resulting from the string matching operations performed by the example hash chain matcher 230. In some examples, the data element outputter 240 outputs a data element corresponding to a pointer having the form <length, relative position> when the hash chain matcher 230 finds a prior repeated data string that matches a data string beginning at the current input buffer position. In such examples, the "length" data element represents the length of the matching repeated data string, and the "relative position" data element represents the distance from the current input buffer position back to the start of the matching repeated data string in the input data buffer 110. However, when the hash chain matcher 230 is unable to find a prior repeated data string that matches a data string beginning at the current input buffer position, in some examples, the data element outputter 240 outputs one or more literals corresponding to the actual data beginning at the current input buffer position. As mentioned above, the example input string reader 205 then advances the current input buffer position by an appropriate amount (e.g., by the length of the matching prior repeated string or by the number of literals output if no matching string is found) to permit the next input data in the input data buffer 110 to be compressed.

Figure 3:
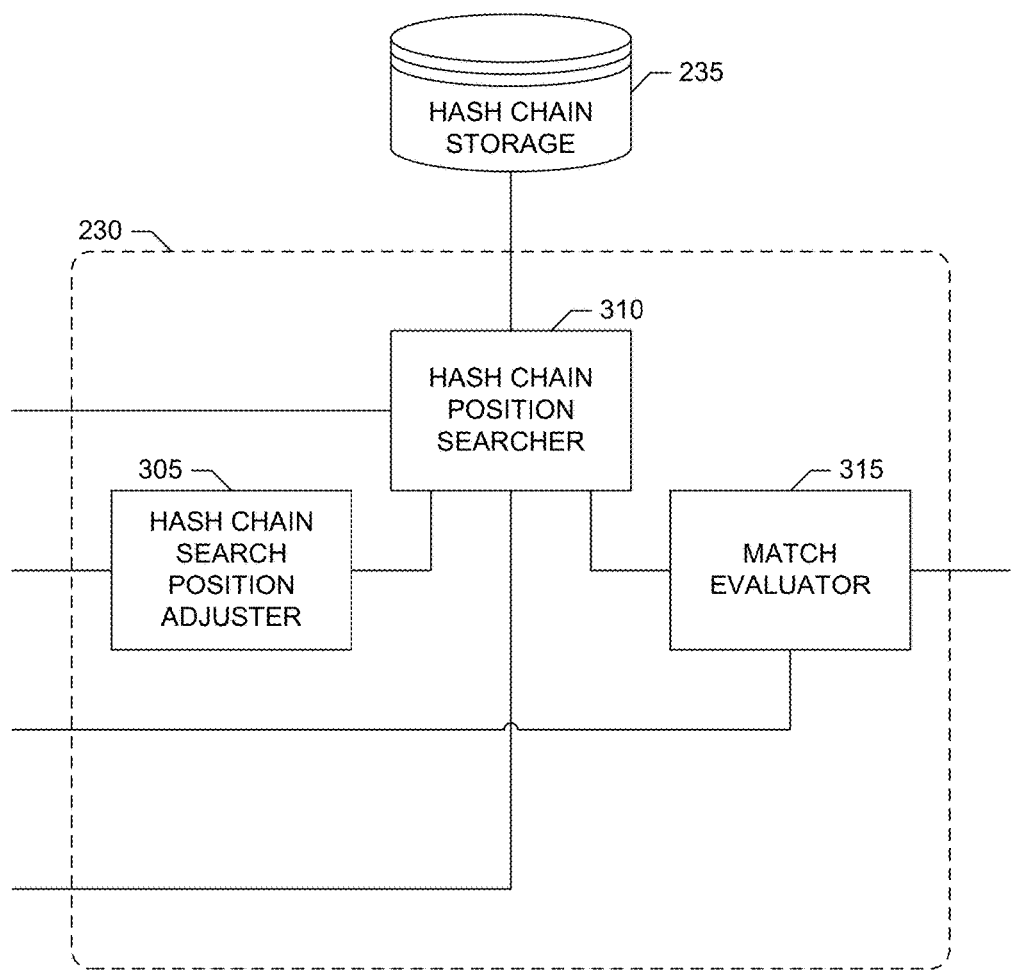
FIG. 3 is a block diagram of an example hash chain matcher that may be used to implement the example data redundancy searchers of FIGS. 1 and/or 2.

A block diagram illustrating an example implementation of the hash chain matcher 230 of FIG. 2 is illustrated in FIG. 3. The example hash chain matcher 230 of FIG. 3 includes an example hash chain search position adjuster 305 to adjust the buffer positions stored in a particular hash chain being searched by the look-ahead offset used to access the input data substring/prefix for indexing the particular hash chain. For example, and as discussed above, the hash chain search position adjuster 305 may subtract the look-ahead offset, which was used to select the particular hash chain, from the buffer positions stored in the hash chain to determine adjusted buffer positions at which the input buffer 110 is to be searched for a prior repeated data string that matches a data string beginning at the current input buffer position.

The example hash chain matcher 230 of FIG. 3 also includes an example hash chain position searcher 310 to use a particular hash chain (e.g., indexed by the hash chain index determined by the example hash indexer 215) to search for a prior repeated data string in the input data buffer 110 that matches a data string beginning at the current input buffer position. For example, the hash chain position searcher 310 may walk the elements of the particular hash chain (e.g., as illustrated in the example of FIG. 7), and search the history of the input data buffer 110 at the positions stored in the elements of the particular hash chain, after adjustment by the example hash chain search position adjuster 305 if the hash chain corresponds to a non-zero look-ahead offset, to find a prior repeated data string in the input data buffer 110 that matches a data string beginning at the current input buffer position.

The example hash chain matcher 230 of FIG. 3 further includes an example match evaluator 315 to evaluate a data string match found by the example hash chain position searcher 310. In some examples, the example match evaluator 315 determines whether a matching prior repeated data string satisfies a length condition before indicating that the match was successful. For example, if the look-ahead offset used to find the matching prior repeated data string was zero (e.g., corresponding to no look-ahead offset), the match evaluator 315 may determine that the length condition is satisfied if the length of the matching prior repeated data string is at least equal to the size (e.g., 3 bytes or some other value) of the substrings/prefixes used to index the hash chains to be searched. As another example, if the look-ahead offset used to find the matching prior repeated data string was a non-zero value, the match evaluator 315 may determine that the length condition is satisfied if the length of the matching prior repeated data string is at least equal to the value of the look-ahead offset plus the size (e.g., 3 bytes or some other value) of the substrings/prefixes used to index the hash chains to be searched. Other length conditions can additionally or alternatively be used by the example match evaluator 315 to determine whether a matching prior repeated data string found by the example match evaluator 315 is acceptable or should be discarded.

While example manners of implementing the example data compressor 100 is illustrated in FIGS. 1-3, one or more of the elements, processes and/or devices illustrated in FIGS. 1-3 may be combined, divided, re-arranged, omitted, eliminated and/or implemented in any other way. Further, the example data redundancy searcher 105, the example input data buffer 110, the example data element encoder 115, the example compressed data buffer 120, the example input string reader 205, the example look-ahead selector 210, the example hash indexer 215, the example hash chain evaluator 220, the example blacklist storage 225, the example hash chain matcher 230, the example hash chain storage 235, the example data element outputter 240, the example hash chain search position adjuster 305, the example hash chain position searcher 310, the example match evaluator 315 and/or, more generally, the example data compressor 100 of FIGS. 1-3 may be implemented by hardware, software, firmware and/or any combination of hardware, software and/or firmware. Thus, for example, any of the example data redundancy searcher 105, the example input data buffer 110, the example data element encoder 115, the example compressed data buffer 120, the example input string reader 205, the example look-ahead selector 210, the example hash indexer 215, the example hash chain evaluator 220, the example blacklist storage 225, the example hash chain matcher 230, the example hash chain storage 235, the example data element outputter 240, the example hash chain search position adjuster 305, the example hash chain position searcher 310, the example match evaluator 315 and/or, more generally, the example data compressor 100 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example data compressor 100, the example data redundancy searcher 105, the example input data buffer 110, the example data element encoder 115, the example compressed data buffer 120, the example input string reader 205, the example look-ahead selector 210, the example hash indexer 215, the example hash chain evaluator 220, the example blacklist storage 225, the example hash chain matcher 230, the example hash chain storage 235, the example data element outputter 240, the example hash chain search position adjuster 305, the example hash chain position searcher 310 and/or the example match evaluator 315 is/are hereby expressly defined to include a tangible computer readable storage device or storage disk such as a memory, a digital versatile disk (DVD), a compact disk (CD), a Blu-ray disk, etc. storing the software and/or firmware. Further still, the example data compressor 100 may include one or more elements, processes and/or devices in addition to, or instead of, those illustrated in FIGS. 1-3, and/or may include more than one of any or all of the illustrated elements, processes and devices.

Figure 4:
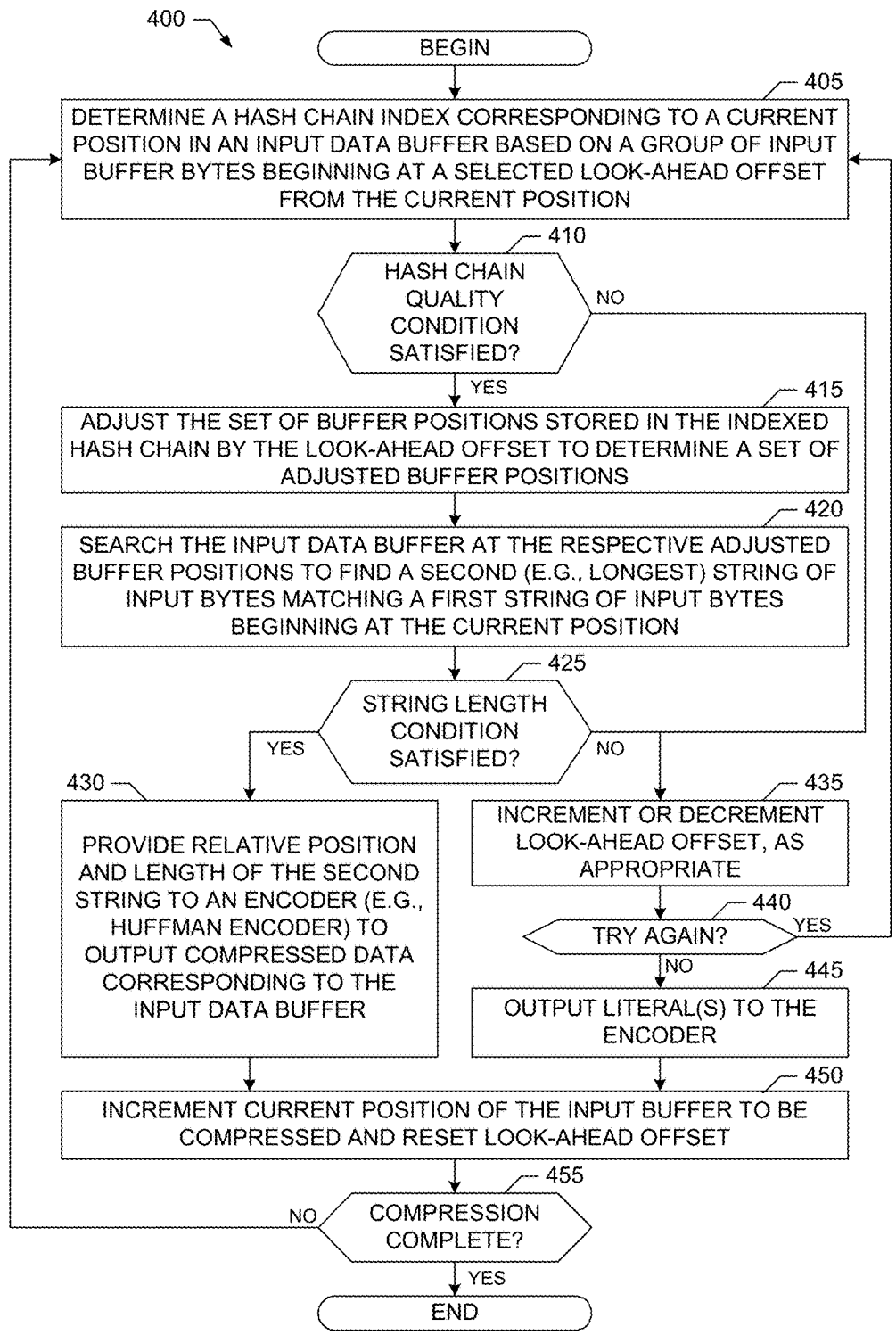
FIG. 4 is a flowchart representative of first example machine readable instructions that may be executed to implement the example data redundancy searchers of FIGS. 1 and/or 2.
Figure 5A:
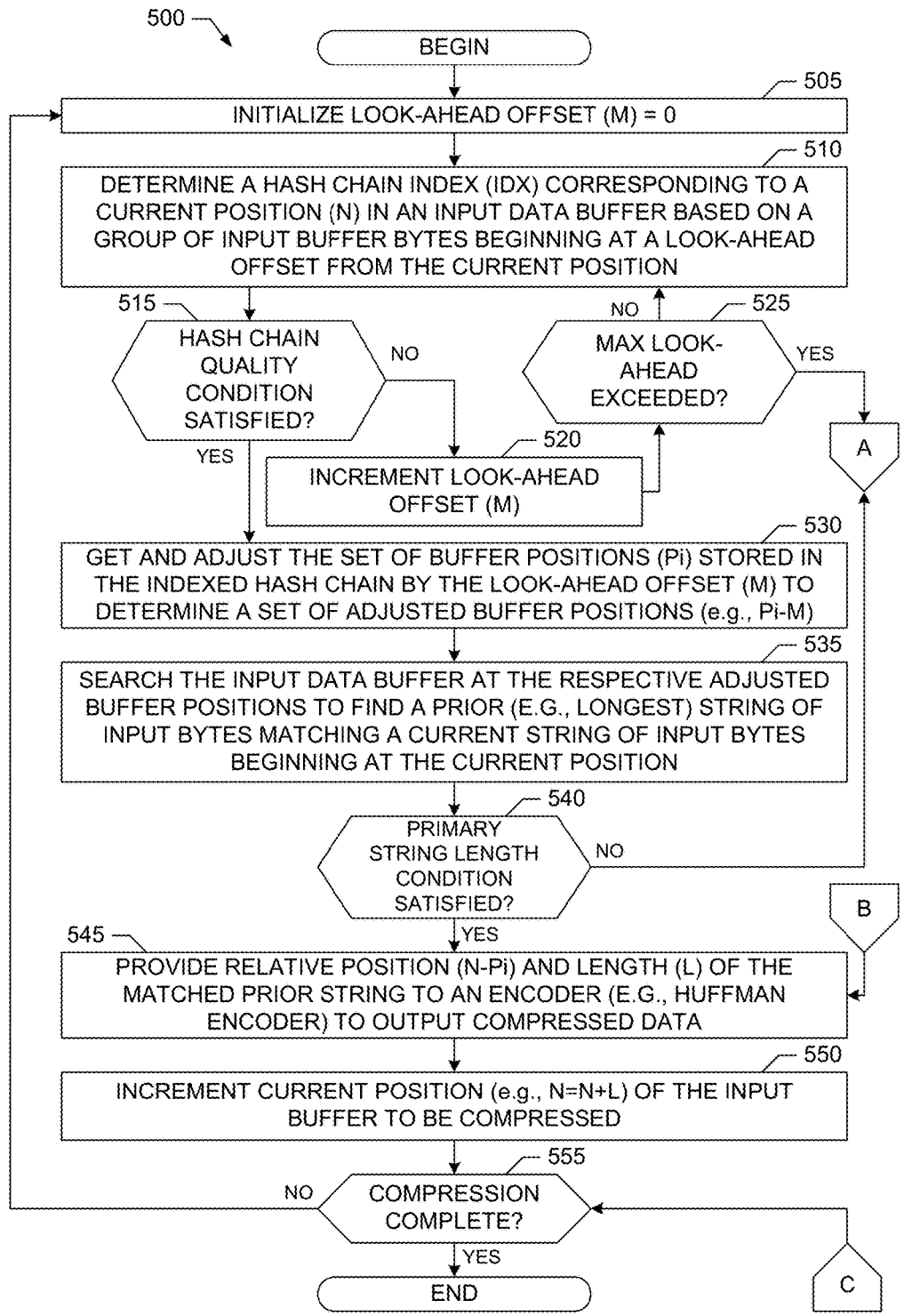
FIGS. 5A-5B collectively form a flowchart representative of second example machine readable instructions that may be executed to implement the example data redundancy searchers of FIGS. 1 and/or 2.
Figure 5B:
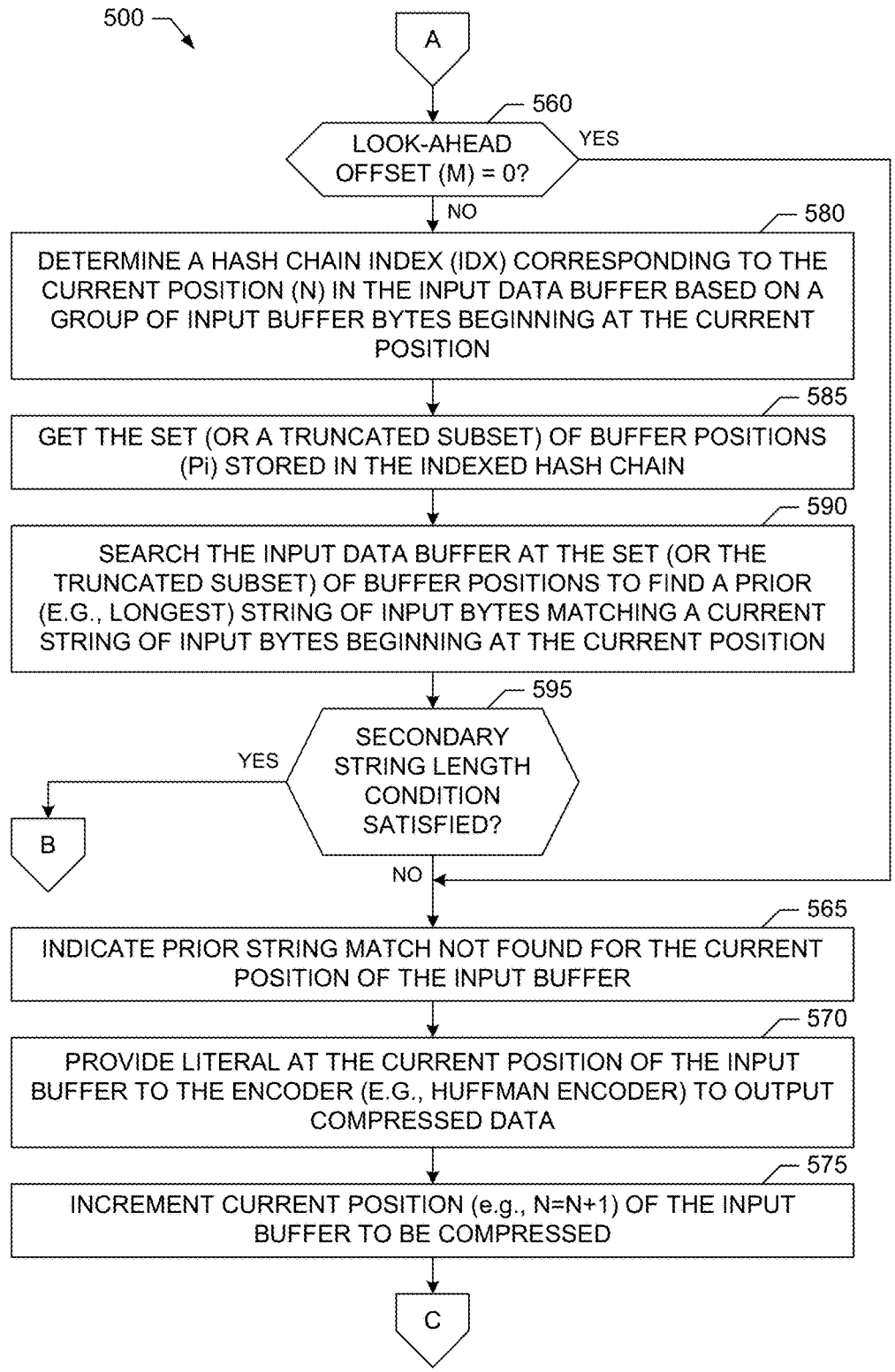

Flowcharts representative of example machine readable instructions for implementing the example data compressor 100, the example data redundancy searcher 105, the example input data buffer 110, the example data element encoder 115, the example compressed data buffer 120, the example input string reader 205, the example look-ahead selector 210, the example hash indexer 215, the example hash chain evaluator 220, the example blacklist storage 225, the example hash chain matcher 230, the example hash chain storage 235, the example data element outputter 240, the example hash chain search position adjuster 305, the example hash chain position searcher 310 and/or the example match evaluator 315 are shown in FIGS. 4 and 5A-5B. In these examples, the machine readable instructions comprise one or more programs for execution by a processor, such as the processor 812 shown in the example processor platform 800 discussed below in connection with FIG. 8. The one or more programs, or portion(s) thereof, may be embodied in software stored on a tangible computer readable storage medium such as a CD-ROM, a floppy disk, a hard drive, a digital versatile disk (DVD), a Blu-ray Disk™, or a memory associated with the processor 812, but the entire program or programs and/or portions thereof could alternatively be executed by a device other than the processor 812 and/or embodied in firmware or dedicated hardware (e.g., implemented by an ASIC, a PLD, an FPLD, discrete logic, etc.). Further, although the example program(s) is(are) described with reference to the flowcharts illustrated in FIGS. 4 and 5A-5B, many other methods of implementing the example data compressor 100, the example data redundancy searcher 105, the example input data buffer 110, the example data element encoder 115, the example compressed data buffer 120, the example input string reader 205, the example look-ahead selector 210, the example hash indexer 215, the example hash chain evaluator 220, the example blacklist storage 225, the example hash chain matcher 230, the example hash chain storage 235, the example data element outputter 240, the example hash chain search position adjuster 305, the example hash chain position searcher 310 and/or the example match evaluator 315 may alternatively be used. For example, with reference to the flowcharts illustrated in FIGS. 4 and 5A-B, the order of execution of the blocks may be changed, and/or some of the blocks described may be changed, eliminated, combined and/or subdivided into multiple blocks.

As mentioned above, the example processes of FIGS. 4 and 5A-5B may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 4 and 5A-5B may be implemented using coded instructions (e.g., computer and/or machine readable instructions) stored on a non-transitory computer and/or machine readable medium such as a hard disk drive, a flash memory, a ROM, a CD, a DVD, a cache, a RAM and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the terms "comprising" and "including" are open ended. Also, as used herein, the terms "computer readable" and "machine readable" are considered equivalent unless indicated otherwise.

A first example program 400 that may be executed to implement the example data redundancy searcher 105 of FIGS. 1 and/or 2 is represented by the flowchart illustrated in FIG. 4. For convenience and without loss of generality, execution of the example program 400 is described from the perspective of the example data redundancy searcher 105 of FIG. 2 being used to implement the example data compressor of FIG. 1. With reference to the preceding figures and associated written descriptions, the example program 400 of FIG. 4 begins execution at block 405 at which the example hash indexer 215 of the data redundancy searcher 105 determines, as described above, a hash chain index corresponding to the current input buffer position based on a group of input buffer bytes (e.g., a 3-byte substring/prefix) beginning at a selected look-ahead offset from the current input buffer position. For example, the look-ahead offset is determined, as described above, by the example look-ahead selector 210 of the data redundancy searcher 105.

At block 410, the example hash chain evaluator 220 of the data redundancy searcher 105 determines, as described above, whether a hash chain quality condition is satisfied by the hash chain indexed by the hash chain index determined at block 405. If the hash chain quality condition is satisfied (block 410) and, thus, the hash chain is considered to be a good hash chain, at block 415 the example hash chain matcher 230 of the data redundancy searcher 105 adjusts (e.g., using the example hash chain search position adjuster 305) the buffer positions stored in the indexed hash chain by the look-ahead offset to determine a set of adjusted buffer positions to be searched, as described above. At block 420, the example hash chain matcher 230 searches (e.g., using the example hash chain position searcher 310) the input data buffer 110 at the adjusted buffer positions to find a prior repeated data string (e.g., the longest prior repeated data string) matching a data string beginning at the current input buffer position, as described above. Assuming a matching prior repeated data string is found, at block 425 the hash chain matcher 230 determines (e.g., using the example match evaluator 315) whether a length condition for the matching prior repeated data string is satisfied. If the length condition is satisfied (block 425), at block 430 the example data element outputter 240 provides, as described above, the length and the relative position of the matching prior repeated data string to the example data element encoder 115 for encoding into the output compressed data buffer 120 corresponding to the input data buffer 110. Otherwise, processing proceeds to block 435.

Returning to block 410, if the hash chain quality condition is not satisfied for the hash chain indexed by the hash chain index determined at block 405 and, thus, the hash chain is considered to be a bad hash chain, processing also proceeds to block 435. At block 435, the data redundancy searcher 105 determines whether to attempt to perform string matching using another hash chain selected by, for example, incrementing or decrementing the look-ahead offset, as described above. For example, the look-ahead selector 210 of the data redundancy searcher 105 may increment the look-ahead offset (e.g., up to a threshold/maximum look-ahead offset) if the hash chain quality condition was not satisfied at block 410, or decrement (or reset) the look-ahead offset if the string length condition was not satisfied at block 425. At block 440, the data redundancy searcher 105 determines whether data string searching associated with the current input buffer position should continue. For example, at block 440, the data redundancy searcher 105 may determine that data string searching associated with the current input buffer position should continue if the threshold/maximum look-ahead offset has not been exceeded and a search corresponding to a look-ahead offset of 0 has not yet been performed, and that searching associated with the current input buffer position should be stopped otherwise. If searching should continue (block 440), then processing returns to block 405 and blocks subsequent thereto at which the data redundancy searcher 105 begins searching for a prior repeated string matching a data string beginning at the current input buffer position, but using a new hash chain index corresponding to the updated look-ahead offset determined at block 435.

However, if searching should not continue (block 440), processing proceeds to block 445. At block 445, the example data element outputter 240 then outputs one or more literals beginning at the current input buffer position (because no matching prior repeated data string has been found) to the example data element encoder 115 for encoding into the output compressed data buffer 120 corresponding to the input data buffer 110. At block 450, the example input string reader 205 of the data redundancy searcher 105 advances the current input buffer position by an appropriate amount (e.g., by the length of the matching prior repeated string or by the number of literals output if no matching string is found) to permit the next input data in the input data buffer 110 to be compressed. At block 450, the look-ahead selector 210 also resets the look-ahead offset to a starting value (e.g., 0 or some other value).

At block 455, the input string reader 205 determines whether compression of the input data buffer 110 is complete. If data compression is not complete (block 455), processing returns to block 405 and blocks subsequent thereto to permit the data redundancy searcher 105 to begin processing the next input data in the input data buffer 110. Otherwise, execution of the example program 400 ends.

A second example program 500 that may be executed to implement the example data redundancy searcher 105 of FIGS. 1 and/or 2 is represented by the flowchart illustrated collectively in FIGS. 5A-5B. Example pseudocode 600 corresponding to at least portions of the example program 500 is provided in FIG. 6. For convenience and without loss of generality, execution of the example program 500 and the example pseudocode 600 is described from the perspective of the example data redundancy searcher 105 of FIG. 2 being used to implement the example data compressor of FIG. 1. With reference to the preceding figures and associated written descriptions, the example program 500 begins execution at block 505 of FIG. 5A at which the example look-ahead selector 210 of the data redundancy searcher 105 initializes the look-ahead offset (represented by "M" in the figure) to 0. The processing at block 505 corresponds to the processing at pseudocode line 604 in FIG. 6.

At block 510, the example hash indexer 215 of the data redundancy searcher 105 determines, as described above, a hash chain index (represented by "IDX" in the figure) corresponding to the current input buffer position (represented by "N" in the figure) based on a group of input buffer bytes (e.g., a B-byte substring/prefix, where B=3 or some other number) beginning at the current input buffer position (because the look-ahead offset is currently set to 0). At block 515, the example hash chain evaluator 220 of the data redundancy searcher 105 determines, as described above, whether a hash chain quality condition is satisfied by the hash chain indexed by the hash chain index determined at block 510. If the hash chain quality condition is not satisfied (block 515) and, thus, the hash chain is considered to be a bad hash chain, at block 520 the look-ahead selector 210 increments the look-ahead offset (M). At block 525, the look-ahead selector 210 determines whether the incremented look-ahead offset exceeds a threshold. If the threshold is not exceeded (block 525), the processing at blocks 510-525 continues until the look-ahead offset yields a hash chain satisfying the quality condition, or the look-ahead threshold is exceeded. The processing at blocks 510-525 corresponds to the processing at pseudocode lines 612-628 in FIG. 6.

Assuming that, through the processing at block 510-525, a look-ahead offset yielding a good hash chain is found, at block 530 the example hash chain matcher 230 of the data redundancy searcher 105 gets and adjusts (e.g., using the example hash chain search position adjuster 305) the buffer positions (represented by "Pi" in the figure) stored in the indexed hash chain by the look-ahead offset (M) to determine a set of adjusted buffer positions (represented by "Pi-M" in the figure) to be searched, as described above. In the illustrated example, the data redundancy searcher 105 determines the adjusted buffer positions (Pi-M) at block 530 by subtracting the look-ahead offset (M) from the buffer positions (Pi) stored in the indexed hash chain. The processing at block 530 corresponds to the processing at pseudocode lines 632-636 in FIG. 6.

At block 535, the example hash chain matcher 230 searches (e.g., using the example hash chain position searcher 310) the input data buffer 110 at the adjusted buffer positions to find a prior repeated data string (e.g., the longest prior repeated data string) matching a data string beginning at the current input buffer position, as described above. The processing at block 535 corresponds to the processing at pseudocode line 640 in FIG. 6. Assuming a matching prior repeated data string is found, at block 540 the hash chain matcher 230 determines (e.g., using the example match evaluator 315) whether a primary length condition for the matching prior repeated data string is satisfied. For example, at block 540, the hash chain matcher 230 determines whether the length (represented by "L" in the figure) of the matching prior repeated data string found at block 530 is greater than or equal to the size of the group of bytes (B) forming the substring/prefix used for hash chain indexing plus the look-ahead offset (M) (e.g., L≥B+M). If the primary length condition is satisfied (block 540), at block 545 the example data element outputter 240 provides, as described above, the length (L) and the relative position (N-Pi) of the matching prior repeated data string in the input buffer 110 to the example data element encoder 115 for encoding into the output compressed data buffer 120 corresponding to the input data buffer 110. The processing at blocks 540-545 corresponds to the processing at pseudocode line 644 in FIG. 6.

At block 550, the example input string reader 205 of the data redundancy searcher 105 advances the current input buffer position by an appropriate amount (e.g., by the length of the matching prior repeated string, corresponding to N=N+L) to permit the next input data in the input data buffer 110 to be compressed. At block 555, the input string reader 205 determines whether compression of the input data buffer 110 is complete. If data compression is not complete (block 555), processing returns to block 505 and blocks subsequent thereto to permit the data redundancy searcher 105 to begin processing the next input data in the input data buffer 110. Otherwise, execution of the example program 500 ends.

However, if the processing at block 510-525 does not result in a look-ahead offset yielding a good hash chain, or if at block 540 the matching prior repeated data string does not match the primary string length condition, processing proceed to block 560 of FIG. 5B. At block 560, the hash chain matcher 230 determines whether the look-ahead offset (M) is set to 0. If the look-ahead offset (M) is set to 0 (block 560), this means that the data redundancy searcher 105 determined that chain0 (corresponding to no look-ahead offset) was a good chain, but no prior repeated data string having a length of at least B bytes (e.g., 3 bytes) was found. Accordingly, processing proceeds to block 565 at which the hash chain matcher 230 indicates that no prior repeated data string was found to match a string beginning at the current buffer location. The processing at block 565 corresponds to the processing at pseudocode line 652 in FIG. 6.

At block 570, the example data element outputter 240 outputs the literal (e.g., the 1-byte character) at the current position of the input data buffer 110 to the example data element encoder 115 for encoding into the output compressed data buffer 120 corresponding to the input data buffer 110. At block 575, the example input string reader 205 of the data redundancy searcher 105 advances the current input buffer position by an appropriate amount (e.g., by the number of literals output by the data element outputter 240, such as, N=N+1) to permit the next input data in the input data buffer 110 to be compressed. Processing then proceeds to block 555, which is described in detail above.

Returning to block 560, if the hash chain matcher 230 determines the look-ahead offset (M) is not set to 0 (block 560), this means the data redundancy searcher 105 has determined that either (i) some hash chain other than chain0 (corresponding to no look-ahead offset) was a good chain, but no prior repeated data string meeting the primary string length condition for that chain (e.g., a length of at least M+B bytes) was found, or (ii) the threshold look-ahead offset was exceeded. In the illustrated example, processing proceeds to block 580 at which the hash indexer 215 defaults to determining a hash chain index (IDX) corresponding to the current input buffer position (N) based on a group of input buffer bytes (e.g., B) beginning at the current input buffer position with no look-ahead offset. The processing at block 580 corresponds to the processing at pseudocode line 660 in FIG. 6.

At block 585, the example hash chain matcher 230 gets the buffer positions (Pi) stored in the indexed hash chain and, in some examples, prunes the set of buffer positions (Pi) to form a truncated set (e.g., of the first X buffer positions stored in the indexed hash chain, where X=8 or some other value). The processing at block 585 corresponds to the processing at pseudocode lines 664-668 in FIG. 6. At block 590, the example hash chain matcher 230 searches the input data buffer 110 at the truncated set of buffer positions to find a prior repeated data string matching a data string beginning at the current input buffer position, as described above. In the illustrated example, the hash chain matcher 230 can stop searching at block 590 as soon as a matching prior repeated data string is found to have a length equal to the size of the group of bytes (B) forming the substring/prefix used for hash chain indexing plus one less than the final value of the look-ahead offset (M) (e.g., L=B+M−1). This is because that data redundancy searcher 105 has already determined that no matching prior repeated data string corresponding to the final value of the look-ahead offset (M) was found. The processing at block 590 corresponds to the processing at pseudocode line 672 in FIG. 6.

Assuming a matching prior repeated data string is found, at block 595 the hash chain matcher 230 determines whether a secondary string length condition for the matching prior repeated data string is satisfied. For example, at block 595, the hash chain matcher 230 determines whether the length (L) of the matching prior repeated data string found at block 590 is between the size of the group of bytes (B) forming the substring/prefix used for hash chain indexing, and this size plus one less than the final value of the look-ahead offset (M) (e.g., B+M−1) or, in other words, if B≤L≤B+M−1). If the secondary string length condition is satisfied (block 595), processing proceeds to block 545, which is described in detail above. However, if the secondary string length condition is not satisfied (block 595), processing proceeds to block 565, which is described in detail above. This processing at block 595, 545 and 565 corresponds to the processing at pseudocode lines 676-680 in FIG. 6.

Figure 8:
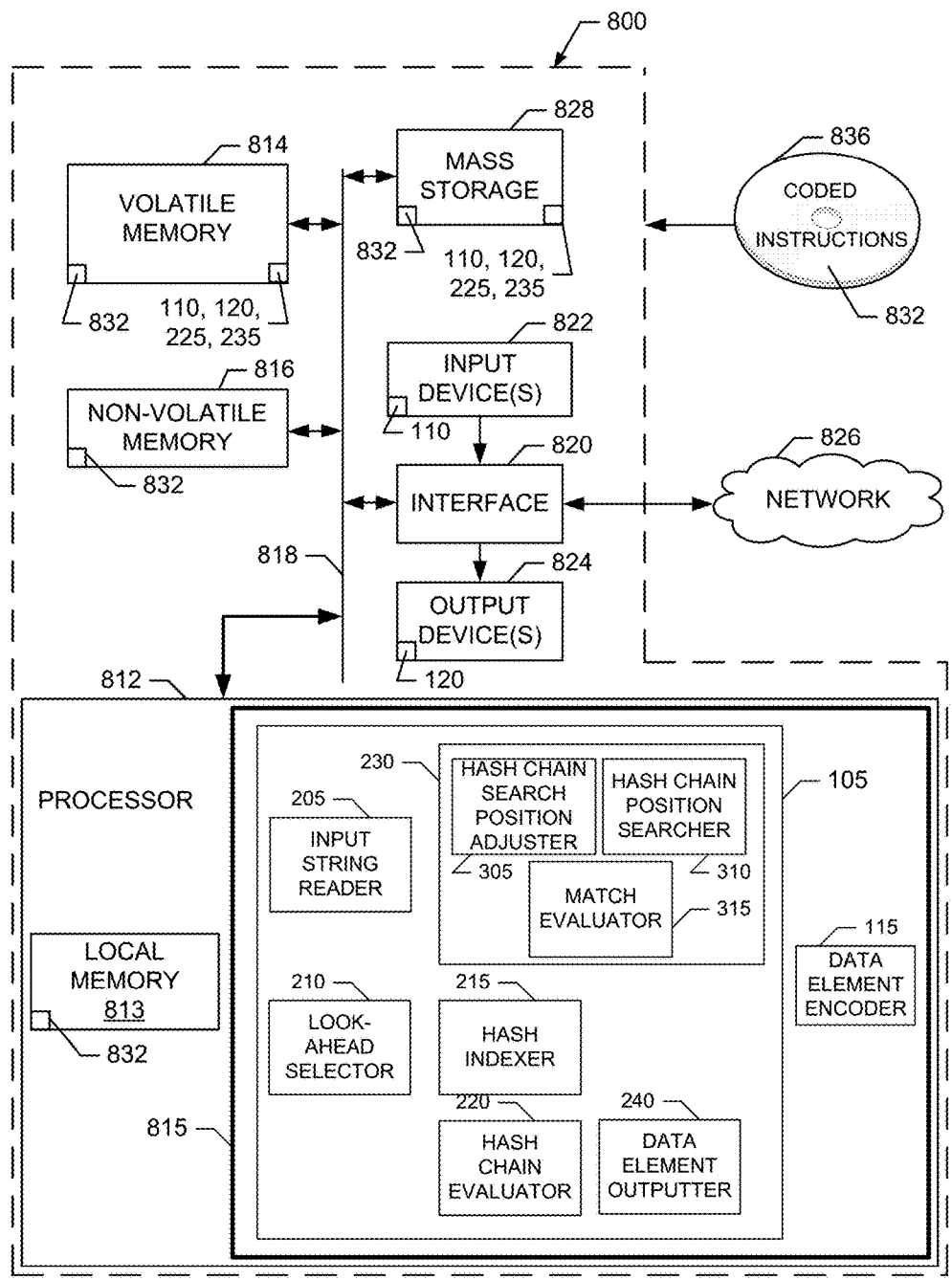
FIG. 8 is a block diagram of an example processor platform structured to execute the example machine readable instructions of FIGS. 4, 5A-5B, and/or 6 to implement the example data redundancy searchers of FIGS. 1 and/or 2 in the example data compressor of FIG. 1.

FIG. 8 is a block diagram of an example processor platform 800 capable of executing the instructions of FIGS. 4, 5A-5B and/or 6 to implement the example data compressor 100 of FIGS. 1-3. The processor platform 800 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box a digital camera, or any other type of computing device.

The processor platform 800 of the illustrated example includes a processor 812. The processor 812 of the illustrated example is hardware. For example, the processor 812 can be implemented by one or more integrated circuits, logic circuits, microprocessors or controllers from any desired family or manufacturer. In the illustrated example of FIG. 8, the processor 812 includes one or more example processing cores 815 configured via example instructions 832, which include the example instructions of FIGS. 4, 5A-5B and/or 6, to implement the example data redundancy searcher 105, the example data element encoder 115, the example input string reader 205, the example look-ahead selector 210, the example hash indexer 215, the example hash chain evaluator 220, the example hash chain matcher 230, the example data element outputter 240, the example hash chain search position adjuster 305, the example hash chain position searcher 310 and/or the example match evaluator 315 of FIGS. 1-3.

The processor 812 of the illustrated example includes a local memory 813 (e.g., a cache). The processor 812 of the illustrated example is in communication with a main memory including a volatile memory 814 and a non-volatile memory 816 via a link 818. The link 818 may be implemented by a bus, one or more point-to-point connections, etc., or a combination thereof. The volatile memory 814 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 816 may be implemented by flash memory and/or any other desired type of memory device. Access to the main memory 814, 816 is controlled by a memory controller.

The processor platform 800 of the illustrated example also includes an interface circuit 820. The interface circuit 820 may be implemented by any type of interface standard, such as an Ethernet interface, a universal serial bus (USB), and/or a PCI express interface.

In the illustrated example, one or more input devices 822 are connected to the interface circuit 820. The input device(s) 822 permit(s) a user to enter data and commands into the processor 812. The input device(s) can be implemented by, for example, an audio sensor, a microphone, a camera (still or video), a keyboard, a button, a mouse, a touchscreen, a track-pad, a trackball, a trackbar (such as an isopoint), a voice recognition system and/or any other human-machine interface. Also, many systems, such as the processor platform 800, can allow the user to control the computer system and provide data to the computer using physical gestures, such as, but not limited to, hand or body movements, facial expressions, and face recognition. In some examples, one or more input devices 822 is/are structured to provide the example input data buffer 110 to be compressed by the example data compressor 100.

One or more output devices 824 are also connected to the interface circuit 820 of the illustrated example. The output devices 824 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 820 of the illustrated example, thus, typically includes a graphics driver card, a graphics driver chip or a graphics driver processor. In some examples, one or more output devices 824 is/are structured to accept the example compressed data buffer 120 output by the example data compressor 100.

The interface circuit 820 of the illustrated example also includes a communication device such as a transmitter, a receiver, a transceiver, a modem and/or network interface card to facilitate exchange of data with external machines (e.g., computing devices of any kind) via a network 826 (e.g., an Ethernet connection, a digital subscriber line (DSL), a telephone line, coaxial cable, a cellular telephone system, etc.).

The processor platform 800 of the illustrated example also includes one or more mass storage devices 828 for storing software and/or data. Examples of such mass storage devices 828 include floppy disk drives, hard drive disks, compact disk drives, Blu-ray disk drives, RAID (redundant array of independent disks) systems, and digital versatile disk (DVD) drives. In some examples, the mass storage device 828 may implement one or more of the example input data buffer 110, the example compressed data buffer 120, the example blacklist storage 225 and/or the example hash chain storage 235. Additionally or alternatively, in some examples the volatile memory 814 may implement one or more of the example input data buffer 110, the example compressed data buffer 120, the example blacklist storage 225 and/or the example hash chain storage 235.

Coded instructions 832 corresponding to the instructions of FIGS. 4, 5A-B and/or 6 may be stored in the mass storage device 828, in the volatile memory 814, in the non-volatile memory 816, in the local memory 813 and/or on a removable tangible computer readable storage medium, such as a CD or DVD 836.

The following further examples, which include subject matter such as a method for data compression, means for performing data compression, at least one computer-readable medium including instructions that, when executed by a processor, cause the processor to perform data compression, and an apparatus and/or a system for data compression are disclosed herein.

Example 1 is a data compression method, which includes determining a first hash chain index corresponding to a first position in an input data buffer based on a first group of bytes accessed from the input data buffer beginning at a first look-ahead offset from the first position. The method of example 1 also includes, in response to determining a first hash chain, which is indexed in memory by the first hash chain index, satisfies a quality condition, searching the input data buffer at respective adjusted buffer positions corresponding to ones of a first set of buffer positions stored in the first hash chain being offset by the first look-ahead offset to find a second string of data bytes matching a first string of data bytes beginning at the first position in the input data buffer. The method of example 1 further includes, in response to determining the second string of data bytes satisfies a length condition, providing a relative position and a length of the second string of data bytes to an encoder to output compressed data corresponding to the input data buffer.

Example 2 includes the subject matter of example 1, wherein the first group of bytes includes a first number of bytes beginning at the first look-ahead offset from the first position, and the determining of the first hash chain index includes processing the first group of bytes with a hash function to determine the first hash chain index.

Example 3 includes the subject matter of example 1, wherein the first hash chain is determined to satisfy the quality condition when at least one of the first hash chain index is not included in a blacklist of hash chain indices, or a number of buffer positions stored in the first hash chain satisfies a threshold.

Example 4 includes the subject matter of example 1, and further includes subtracting the first look-ahead offset from the ones of the first set of buffer positions stored in the first hash chain to determine the respective adjusted buffer positions.

Example 5 includes the subject matter of example 1, wherein the second string of data bytes satisfies the length condition when the length of the second string of data bytes is greater than or equal to a sum of the first look-ahead offset and a number corresponding to a number of bytes included in the first group of bytes.

Example 6 includes the subject matter of example 1, wherein the length condition is a first length condition, and further includes, when the first hash chain does not satisfy the quality condition: (i) determining a second hash chain index corresponding to the first position in the input data buffer based on a second group of bytes accessed from the input data buffer beginning at a second look-ahead offset from the first position, the second look-ahead offset being larger than the first look-ahead offset; (ii) in response to determining a second hash chain, which is indexed in memory by the second hash chain index, satisfies the quality condition, searching the input data buffer at respective adjusted buffer positions corresponding to ones of a second set of buffer positions stored in the second hash chain being offset by the second look-ahead offset to find a fourth string of data bytes matching a third string of data bytes beginning at the first position in the input data buffer; and (iii) in response to determining the fourth string of data bytes satisfies a second length condition, providing a relative position and a length of the fourth string of data bytes to an encoder to output the compressed data corresponding to the input data buffer.

Example 7 includes the subject matter of example 6, wherein the second string of data bytes satisfies the first length condition when the length of the second string of data bytes is greater than or equal to a sum of the first look-ahead offset and a number, the fourth string of data bytes satisfies the second length condition when the length of the fourth string of data bytes is greater than or equal to a sum of the second look-ahead offset and the number, and the number corresponds to a number of bytes included in the first group of bytes and a number of bytes included in the second group of bytes.

Example 8 includes the subject matter of example 1, wherein the length condition is a first length condition, and further includes, when the second string of data bytes does not satisfy the first length condition: (i) determining a second hash chain index corresponding to the first position in the input data buffer based on a second group of bytes accessed from the input data buffer beginning at the first position in the input data buffer; (ii) searching the input data buffer at respective ones of a subset of a second set of buffer positions stored in a second hash chain, which indexed in memory by the second hash chain index, to find a fourth string of data bytes matching a third string of data bytes beginning at the first position in the input data buffer; and (iii) in response to determining the fourth string of data bytes satisfies a second length condition, providing a relative position and a length of the fourth string of data bytes to an encoder to output the compressed data corresponding to the input data buffer.

Example 9 includes the subject matter of example 8, wherein the fourth string of data bytes satisfies the second length condition when the length of the second string of data bytes is between a first number corresponding to a number of bytes included in the second group of bytes and a second number equal to one less than a sum of the first look-ahead offset and the number of bytes included in the second group of bytes.

Example 10 includes the subject matter of example 8, wherein the subset of the second set of buffer positions stored in the second hash chain corresponds to a first number of buffer positions stored at the beginning of the second hash chain.

Example 11 includes the subject matter of example 1 or example 2, wherein the first hash chain is determined to satisfy the quality condition when at least one of the first hash chain index is not included in a blacklist of hash chain indices, or a number of buffer positions stored in the first hash chain satisfies a threshold.

Example 12 includes the subject matter of any one of examples 1, 2, or 11, and further includes subtracting the first look-ahead offset from the ones of the first set of buffer positions stored in the first hash chain to determine the respective adjusted buffer positions.

Example 13 includes the subject matter of any one of examples 1, 2, 11 or 12, wherein the second string of data bytes satisfies the length condition when the length of the second string of data bytes is greater than or equal to a sum of the first look-ahead offset and a number corresponding to a number of bytes included in the first group of bytes.

Example 14 includes the subject matter of any one of examples 1, 2 or 11-13, wherein the length condition is a first length condition, and further includes, when the first hash chain does not satisfy the quality condition: (i) determining a second hash chain index corresponding to the first position in the input data buffer based on a second group of bytes accessed from the input data buffer beginning at a second look-ahead offset from the first position, the second look-ahead offset being larger than the first look-ahead offset; (ii) in response to determining a second hash chain, which is indexed in memory by the second hash chain index, satisfies the quality condition, searching the input data buffer at respective adjusted buffer positions corresponding to ones of a second set of buffer positions stored in the second hash chain being offset by the second look-ahead offset to find a fourth string of data bytes matching a third string of data bytes beginning at the first position in the input data buffer; and (iii) in response to determining the fourth string of data bytes satisfies a second length condition, providing a relative position and a length of the fourth string of data bytes to an encoder to output the compressed data corresponding to the input data buffer.

Example 15 includes the subject matter of example 14, wherein the second string of data bytes satisfies the first length condition when the length of the second string of data bytes is greater than or equal to a sum of the first look-ahead offset and a number, the fourth string of data bytes satisfies the second length condition when the length of the fourth string of data bytes is greater than or equal to a sum of the second look-ahead offset and the number, and the number corresponds to a number of bytes included in the first group of bytes and a number of bytes included in the second group of bytes.

Example 16 includes the subject matter of any one of examples 1, 2 or 11-13, wherein the length condition is a first length condition, and further includes, when the second string of data bytes does not satisfy the first length condition: (i) determining a second hash chain index corresponding to the first position in the input data buffer based on a second group of bytes accessed from the input data buffer beginning at the first position in the input data buffer; (ii) searching the input data buffer at respective ones of a subset of a second set of buffer positions stored in a second hash chain, which is indexed in memory by the second hash chain index, to find a fourth string of data bytes matching a third string of data bytes beginning at the first position in the input data buffer; and (iii) in response to determining the fourth string of data bytes satisfies a second length condition, providing a relative position and a length of the fourth string of data bytes to an encoder to output the compressed data corresponding to the input data buffer.

Example 17 includes the subject matter of example 16, wherein the fourth string of data bytes satisfies the second length condition when the length of the second string of data bytes is between a first number corresponding to a number of bytes included in the second group of bytes and a second number equal to one less than a sum of the first look-ahead offset and the number of bytes included in the second group of bytes.

Example 18 includes the subject matter of example 16 or example 17, wherein the subset of the second set of buffer positions stored in the second hash chain corresponds to a first number of buffer positions stored at the beginning of the second hash chain.

Example 19 is a tangible computer readable storage medium including computer readable instructions which, when executed, cause a processor to at least: determine a first hash chain index corresponding to a first position in an input data buffer based on a first group of bytes accessed from the input data buffer beginning at a first look-ahead offset from the first position; when a first hash chain, which is indexed in memory by the first hash chain index, satisfies a quality condition, search the input data buffer at respective adjusted buffer positions corresponding to ones of a first set of buffer positions stored in the first hash chain being offset by the first look-ahead offset to find a second string of data bytes matching a first string of data bytes beginning at the first position in the input data buffer; and when the second string of data bytes satisfies a length condition, provide a relative position and a length of the second string of data bytes to an encoder to output compressed data corresponding to the input data buffer.

Example 20 includes the subject matter of example 19, wherein the first group of bytes includes a first number of bytes beginning at the first look-ahead offset from the first position, and to determine the first hash chain index, the instructions, when executed, cause the processor to process the first group of bytes with a hash function to determine the first hash chain index.

Example 21 includes the subject matter of example 19, wherein the first hash chain is determined to satisfy the quality condition when at least one of the first hash chain index is not included in a blacklist of hash chain indices, or a number of buffer positions stored in the first hash chain satisfies a threshold.

Example 22 includes the subject matter of example 19, wherein the instructions, when executed, further cause the processor to subtract the first look-ahead offset from the ones of the first set of buffer positions stored in the first hash chain to determine the respective adjusted buffer positions.

Example 23 includes the subject matter of example 19, wherein the second string of data bytes satisfies the length condition when the length of the second string of data bytes is greater than or equal to a sum of the first look-ahead offset and a number corresponding to a number of bytes included in the first group of bytes.

Example 24 includes the subject matter of example 19, wherein the length condition is a first length condition, and when the first hash chain does not satisfy the quality condition, the instructions, when executed, further cause the processor to: determine a second hash chain index corresponding to the first position in the input data buffer based on a second group of bytes accessed from the input data buffer beginning at a second look-ahead offset from the first position, the second look-ahead offset being larger than the first look-ahead offset; when a second hash chain, which is indexed in memory by the second hash chain index, satisfies the quality condition, search the input data buffer at respective adjusted buffer positions corresponding to ones of a second set of buffer positions stored in the second hash chain being offset by the second look-ahead offset to find a fourth string of data bytes matching a third string of data bytes beginning at the first position in the input data buffer; and when the fourth string of data bytes satisfies a second length condition, provide a relative position and a length of the fourth string of data bytes to an encoder to output the compressed data corresponding to the input data buffer.

Example 25 includes the subject matter of example 24, wherein the second string of data bytes satisfies the first length condition when the length of the second string of data bytes is greater than or equal to a sum of the first look-ahead offset and a number, the fourth string of data bytes satisfies the second length condition when the length of the fourth string of data bytes is greater than or equal to a sum of the second look-ahead offset and the number, and the number corresponds to a number of bytes included in the first group of bytes and a number of bytes included in the second group of bytes.

Example 26 includes the subject matter of example 19, wherein the length condition is a first length condition, and when the second string of data bytes does not satisfy the first length condition, the instructions, when executed, further cause the processor to: determine a second hash chain index corresponding to the first position in the input data buffer based on a second group of bytes accessed from the input data buffer beginning at the first position in the input data buffer; search the input data buffer at respective ones of a subset of a second set of buffer positions stored in a second hash chain, which is indexed in memory by the second hash chain index, to find a fourth string of data bytes matching a third string of data bytes beginning at the first position in the input data buffer; and when the fourth string of data bytes satisfies a second length condition, provide a relative position and a length of the fourth string of data bytes to an encoder to output the compressed data corresponding to the input data buffer.

Example 27 includes the subject matter of example 26, wherein the fourth string of data bytes satisfies the second length condition when the length of the second string of data bytes is between a first number corresponding to a number of bytes included in the second group of bytes and a second number equal to one less than a sum of the first look-ahead offset and the number of bytes included in the second group of bytes.

Example 28 includes the subject matter of example 26, wherein the subset of the second set of buffer positions stored in the second hash chain corresponds to a first number of buffer positions stored at the beginning of the second hash chain.

Example 29 is a tangible computer readable storage medium including computer readable instructions which, when executed, cause a processor to perform the method defined in any one of examples 1, 2, or 11-18.

Example 30 is a data compressor, which includes a hash indexer to determine a first hash chain index corresponding to a first position in an input data buffer based on a first group of bytes accessed from the input data buffer beginning at a first look-ahead offset from the first position. The data compressor of example 30 also includes a hash chain matcher to, when a first hash chain, which is indexed in memory by the first hash chain index, satisfies a quality condition, search the input data buffer at respective adjusted buffer positions corresponding to ones of a first set of buffer positions stored in the first hash chain being offset by the first look-ahead offset to find a second string of data bytes matching a first string of data bytes beginning at the first position in the input data buffer. The data compressor of example 30 further includes a data element outputter to, when the second string of data bytes satisfies a length condition, provide a relative position and a length of the second string of data bytes to an encoder to output compressed data corresponding to the input data buffer.

Example 31 includes the subject matter of example 30, wherein the first group of bytes includes a first number of bytes beginning at the first look-ahead offset from the first position, and to determine the first hash chain index, the hash indexer is to process the first group of bytes with a hash function to determine the first hash chain index.

Example 32 includes the subject matter of example 30, and further includes a hash chain evaluator to determine the first hash chain satisfies the quality condition when at least one of the first hash chain index is not included in a blacklist of hash chain indices, or a number of buffer positions stored in the first hash chain satisfies a threshold.

Example 33 includes the subject matter of example 30, wherein the hash chain matcher is further to subtract the first look-ahead offset from the ones of the first set of buffer positions stored in the first hash chain to determine the respective adjusted buffer positions.

Example 34 includes the subject matter of example 30, wherein the hash chain matcher is further to determine the second string of data bytes satisfies the length condition when the length of the second string of data bytes is greater than or equal to a sum of the first look-ahead offset and a number corresponding to a number of bytes included in the first group of bytes.

Example 35 includes the subject matter of example 30, wherein the length condition is a first length condition, and when the first hash chain does not satisfy the quality condition: (i) the hash indexer is further to determine a second hash chain index corresponding to the first position in the input data buffer based on a second group of bytes accessed from the input data buffer beginning at a second look-ahead offset from the first position, the second look-ahead offset being larger than the first look-ahead offset; (ii) the hash chain matcher is further to, when a second hash chain, which is indexed in memory by the second hash chain index, satisfies the quality condition, search the input data buffer at respective adjusted buffer positions corresponding to ones of a second set of buffer positions stored in the second hash chain being offset by the second look-ahead offset to find a fourth string of data bytes matching a third string of data bytes beginning at the first position in the input data buffer; and (iii) the data element outputter is further to, when the fourth string of data bytes satisfies a second length condition, provide a relative position and a length of the fourth string of data bytes to an encoder to output the compressed data corresponding to the input data buffer.

Example 36 includes the subject matter of example 35, wherein the hash chain matcher is further to determine the second string of data bytes satisfies the first length condition when the length of the second string of data bytes is greater than or equal to a sum of the first look-ahead offset and a number, and the fourth string of data bytes satisfies the second length condition when the length of the fourth string of data bytes is greater than or equal to a sum of the second look-ahead offset and the number, wherein the number corresponds to a number of bytes included in the first group of bytes and a number of bytes included in the second group of bytes.

Example 37 includes the subject matter of example 30, wherein the length condition is a first length condition, and when the second string of data bytes does not satisfy the first length condition: (i) the hash indexer is further to determine a second hash chain index corresponding to the first position in the input data buffer based on a second group of bytes accessed from the input data buffer beginning at the first position in the input data buffer; (ii) the hash chain matcher is further to search the input data buffer at respective ones of a subset of a second set of buffer positions stored in a second hash chain, which is indexed in memory by the second hash chain index, to find a fourth string of data bytes matching a third string of data bytes beginning at the first position in the input data buffer; and (iii) the data element outputter is further to, when the fourth string of data bytes satisfies a second length condition, provide a relative position and a length of the fourth string of data bytes to an encoder to output the compressed data corresponding to the input data buffer.

Example 38 includes the subject matter of example 37, wherein the hash chain matcher is further to determine the fourth string of data bytes satisfies the second length condition when the length of the second string of data bytes is between a first number corresponding to a number of bytes included in the second group of bytes and a second number equal to one less than a sum of the first look-ahead offset and the number of bytes included in the second group of bytes.

Example 39 includes the subject matter of example 37, wherein the subset of the second set of buffer positions stored in the second hash chain corresponds to a first number of buffer positions stored at the beginning of the second hash chain.

Example 40 includes the subject matter of example 30 or example 31, and further includes a hash chain evaluator to determine the first hash chain satisfies the quality condition when at least one of the first hash chain index is not included in a blacklist of hash chain indices, or a number of buffer positions stored in the first hash chain satisfies a threshold.

Example 41 includes the subject matter of any one of examples 30, 31 or 40, wherein the hash chain matcher is further to subtract the first look-ahead offset from the ones of the first set of buffer positions stored in the first hash chain to determine the respective adjusted buffer positions.

Example 42 includes the subject matter of any one of examples 30, 31, 40 or 41, wherein the hash chain matcher is further to determine the second string of data bytes satisfies the length condition when the length of the second string of data bytes is greater than or equal to a sum of the first look-ahead offset and a number corresponding to a number of bytes included in the first group of bytes.

Example 43 includes the subject matter of any one of examples 30, 31 or 40-42, wherein the length condition is a first length condition, and when the first hash chain does not satisfy the quality condition: (i) the hash indexer is further to determine a second hash chain index corresponding to the first position in the input data buffer based on a second group of bytes accessed from the input data buffer beginning at a second look-ahead offset from the first position, the second look-ahead offset being larger than the first look-ahead offset; (ii) the hash chain matcher is further to, when a second hash chain, which is indexed in memory by the second hash chain index, satisfies the quality condition, search the input data buffer at respective adjusted buffer positions corresponding to ones of a second set of buffer positions stored in the second hash chain being offset by the second look-ahead offset to find a fourth string of data bytes matching a third string of data bytes beginning at the first position in the input data buffer; and (iii) the data element outputter is further to, when the fourth string of data bytes satisfies a second length condition, provide a relative position and a length of the fourth string of data bytes to an encoder to output the compressed data corresponding to the input data buffer.

Example 44 includes the subject matter of example 43, wherein the hash chain matcher is further to determine the second string of data bytes satisfies the first length condition when the length of the second string of data bytes is greater than or equal to a sum of the first look-ahead offset and a number, and the fourth string of data bytes satisfies the second length condition when the length of the fourth string of data bytes is greater than or equal to a sum of the second look-ahead offset and the number, wherein the number corresponds to a number of bytes included in the first group of bytes and a number of bytes included in the second group of bytes.

Example 45 includes the subject matter of any one of examples 30, 31 or 40-42, wherein the length condition is a first length condition, and when the second string of data bytes does not satisfy the first length condition: (i) the hash indexer is further to determine a second hash chain index corresponding to the first position in the input data buffer based on a second group of bytes accessed from the input data buffer beginning at the first position in the input data buffer; (ii) the hash chain matcher is further to search the input data buffer at respective ones of a subset of a second set of buffer positions stored in a second hash chain, which is indexed in memory by the second hash chain index, to find a fourth string of data bytes matching a third string of data bytes beginning at the first position in the input data buffer; and (iii) the data element outputter is further to, when the fourth string of data bytes satisfies a second length condition, provide a relative position and a length of the fourth string of data bytes to an encoder to output the compressed data corresponding to the input data buffer.

Example 46 includes the subject matter of example 45, wherein the hash chain matcher is further to determine the fourth string of data bytes satisfies the second length condition when the length of the second string of data bytes is between a first number corresponding to a number of bytes included in the second group of bytes and a second number equal to one less than a sum of the first look-ahead offset and the number of bytes included in the second group of bytes.

Example 47 includes the subject matter of example 45 or example 46, wherein the subset of the second set of buffer positions stored in the second hash chain corresponds to a first number of buffer positions stored at the beginning of the second hash chain.

Example 48 is an apparatus including a processor configured to perform a method as defined in any one of examples 1, 2, or 11-18.

Example 49 is an apparatus including means for determining a first hash chain index corresponding to a first position in an input data buffer based on a first group of bytes accessed from the input data buffer beginning at a first look-ahead offset from the first position. The apparatus of example 49 also includes means for searching, in response to determining a first hash chain, which is indexed in memory by the first hash chain index, satisfies a quality condition, the input data buffer at respective adjusted buffer positions corresponding to ones of a first set of buffer positions stored in the first hash chain being offset by the first look-ahead offset to find a second string of data bytes matching a first string of data bytes beginning at the first position in the input data buffer. The apparatus of example 49 further includes means for providing, in response to determining the second string of data bytes satisfies a length condition, a relative position and a length of the second string of data bytes to an encoder to output compressed data corresponding to the input data buffer.

Example 50 includes the subject matter of example 49, wherein the first group of bytes includes a first number of bytes beginning at the first look-ahead offset from the first position, and the means for determining the first hash chain index includes means for processing the first group of bytes with a hash function to determine the first hash chain index.

Example 51 includes the subject matter of example 49 or example 50, wherein the first hash chain is determined to satisfy the quality condition when at least one of the first hash chain index is not included in a blacklist of hash chain indices, or a number of buffer positions stored in the first hash chain satisfies a threshold.

Example 52 includes the subject matter of any one of examples 49-51, and further includes means for subtracting the first look-ahead offset from the ones of the first set of buffer positions stored in the first hash chain to determine the respective adjusted buffer positions.

Example 53 includes the subject matter of any one of examples 49-52, wherein the second string of data bytes satisfies the length condition when the length of the second string of data bytes is greater than or equal to a sum of the first look-ahead offset and a number corresponding to a number of bytes included in the first group of bytes.

Example 54 includes the subject matter of any one of examples 49-53, wherein the length condition is a first length condition, and further includes, when the first hash chain does not satisfy the quality condition: (i) means for determining a second hash chain index corresponding to the first position in the input data buffer based on a second group of bytes accessed from the input data buffer beginning at a second look-ahead offset from the first position, the second look-ahead offset being larger than the first look-ahead offset; (ii) means for searching, in response to determining a second hash chain, which is indexed in memory by the second hash chain index, satisfies the quality condition, the input data buffer at respective adjusted buffer positions corresponding to ones of a second set of buffer positions stored in the second hash chain being offset by the second look-ahead offset to find a fourth string of data bytes matching a third string of data bytes beginning at the first position in the input data buffer; and (iii) means for providing, in response to determining the fourth string of data bytes satisfies a second length condition, a relative position and a length of the fourth string of data bytes to an encoder to output the compressed data corresponding to the input data buffer.

Example 55 includes the subject matter of example 54, wherein the second string of data bytes satisfies the first length condition when the length of the second string of data bytes is greater than or equal to a sum of the first look-ahead offset and a number, the fourth string of data bytes satisfies the second length condition when the length of the fourth string of data bytes is greater than or equal to a sum of the second look-ahead offset and the number, and the number corresponds to a number of bytes included in the first group of bytes and a number of bytes included in the second group of bytes.

Example 56 includes the subject matter of any one of examples 49-53, wherein the length condition is a first length condition, and further includes, when the second string of data bytes does not satisfy the first length condition: (i) means for determining a second hash chain index corresponding to the first position in the input data buffer based on a second group of bytes accessed from the input data buffer beginning at the first position in the input data buffer; (ii) means for searching the input data buffer at respective ones of a subset of a second set of buffer positions stored in a second hash chain, which is indexed in memory by the second hash chain index, to find a fourth string of data bytes matching a third string of data bytes beginning at the first position in the input data buffer; and (iii) means for providing, in response to determining the fourth string of data bytes satisfies a second length condition, a relative position and a length of the fourth string of data bytes to an encoder to output the compressed data corresponding to the input data buffer.

Example 57 includes the subject matter of example 56, wherein the fourth string of data bytes satisfies the second length condition when the length of the second string of data bytes is between a first number corresponding to a number of bytes included in the second group of bytes and a second number equal to one less than a sum of the first look-ahead offset and the number of bytes included in the second group of bytes.

Example 58 includes the subject matter of example 56 or example 57, wherein the subset of the second set of buffer positions stored in the second hash chain corresponds to a first number of buffer positions stored at the beginning of the second hash chain.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A data compressor comprising:
    a hash indexer to determine a first hash chain index corresponding to a first position in an input data buffer based on a first group of bytes accessed from the input data buffer beginning at a first look-ahead offset from the first position;
    a hash chain matcher to, when a first hash chain, which is indexed in memory by the first hash chain index, satisfies a quality condition, search the input data buffer at respective adjusted buffer positions corresponding to ones of a first set of buffer positions stored in the first hash chain being offset by the first look-ahead offset to find a second string of data bytes matching a first string of data bytes beginning at the first position in the input data buffer; and
    a data element outputter to, when the second string of data bytes satisfies a length condition, provide a relative position and a length of the second string of data bytes to an encoder to output compressed data corresponding to the input data buffer.

2. The data compressor as defined in claim 1, wherein the first group of bytes includes a first number of bytes beginning at the first look-ahead offset from the first position, and to determine the first hash chain index, the hash indexer is to process the first group of bytes with a hash function to determine the first hash chain index.

3. The data compressor as defined in claim 1, further including a hash chain evaluator to determine the first hash chain satisfies the quality condition when at least one of the first hash chain index is not included in a blacklist of hash chain indices, or a number of buffer positions stored in the first hash chain satisfies a threshold.

4. The data compressor as defined in claim 1, wherein the hash chain matcher is further to subtract the first look-ahead offset from the ones of the first set of buffer positions stored in the first hash chain to determine the respective adjusted buffer positions.

5. The data compressor as defined in claim 1, wherein the hash chain matcher is further to determine the second string of data bytes satisfies the length condition when the length of the second string of data bytes is greater than or equal to a sum of the first look-ahead offset and a number corresponding to a number of bytes included in the first group of bytes.

6. The data compressor as defined in claim 1, wherein the length condition is a first length condition, and when the first hash chain does not satisfy the quality condition:

the hash indexer is further to determine a second hash chain index corresponding to the first position in the input data buffer based on a second group of bytes accessed from the input data buffer beginning at a second look-ahead offset from the first position, the second look-ahead offset being larger than the first look-ahead offset;

the hash chain matcher is further to, when a second hash chain, which is indexed in memory by the second hash chain index, satisfies the quality condition, search the input data buffer at respective adjusted buffer positions corresponding to ones of a second set of buffer positions stored in the second hash chain being offset by the second look-ahead offset to find a fourth string of data bytes matching a third string of data bytes beginning at the first position in the input data buffer; and the data element outputter is further to, when the fourth string of data bytes satisfies a second length condition, provide a relative position and a length of the fourth string of data bytes to an encoder to output the compressed data corresponding to the input data buffer.

7. The data compressor as defined in claim 6, wherein the hash chain matcher is further to determine the second string of data bytes satisfies the first length condition when the length of the second string of data bytes is greater than or equal to a sum of the first look-ahead offset and a number, and the fourth string of data bytes satisfies the second length condition when the length of the fourth string of data bytes is greater than or equal to a sum of the second look-ahead offset and the number, wherein the number corresponds to a number of bytes included in the first group of bytes and a number of bytes included in the second group of bytes.

8. The data compressor as defined in claim 1, wherein the length condition is a first length condition, and when the second string of data bytes does not satisfy the first length condition:

the hash indexer is further to determine a second hash chain index corresponding to the first position in the input data buffer based on a second group of bytes accessed from the input data buffer beginning at the first position in the input data buffer;

the hash chain matcher is further to search the input data buffer at respective ones of a subset of a second set of buffer positions stored in a second hash chain, which is indexed in memory by the second hash chain index, to find a fourth string of data bytes matching a third string of data bytes beginning at the first position in the input data buffer; and the data element outputter is further to, when the fourth string of data bytes satisfies a second length condition, provide a relative position and a length of the fourth string of data bytes to an encoder to output the compressed data corresponding to the input data buffer.

9. The data compressor as defined in claim 8, wherein the hash chain matcher is further to determine the fourth string of data bytes satisfies the second length condition when the length of the second string of data bytes is between a first number corresponding to a number of bytes included in the second group of bytes and a second number equal to one less than a sum of the first look-ahead offset and the number of bytes included in the second group of bytes.

10. The data compressor as defined in claim 8, wherein the subset of the second set of buffer positions stored in the second hash chain corresponds to a first number of buffer positions stored at the beginning of the second hash chain.

11. A data compression method comprising:

determining, by executing an instruction with a processor, a first hash chain index corresponding to a first position in an input data buffer based on a first group of bytes accessed from the input data buffer beginning at a first look-ahead offset from the first position;

in response to determining a first hash chain, which is indexed in memory by the first hash chain index, satisfies a quality condition, searching, by executing an instruction with the processor, the input data buffer at respective adjusted buffer positions corresponding to ones of a first set of buffer positions stored in the first hash chain being offset by the first look-ahead offset to find a second string of data bytes matching a first string of data bytes beginning at the first position in the input data buffer; and in response to determining the second string of data bytes satisfies a length condition, providing a relative position and a length of the second string of data bytes to an encoder to output compressed data corresponding to the input data buffer.

12. The data compression method as defined in claim 11, wherein the first group of bytes includes a first number of bytes beginning at the first look-ahead offset from the first position, and the determining of the first hash chain index includes processing the first group of bytes with a hash function to determine the first hash chain index.

13. The data compression method as defined in claim 11, wherein the first hash chain is determined to satisfy the quality condition when at least one of the first hash chain index is not included in a blacklist of hash chain indices, or a number of buffer positions stored in the first hash chain satisfies a threshold.

14. The data compression method as defined in claim 11, further including subtracting the first look-ahead offset from the ones of the first set of buffer positions stored in the first hash chain to determine the respective adjusted buffer positions.

15. The data compression method as defined in claim 11, wherein the second string of data bytes satisfies the length condition when the length of the second string of data bytes is greater than or equal to a sum of the first look-ahead offset and a number corresponding to a number of bytes included in the first group of bytes.

16. The data compression method as defined in claim 11, wherein the length condition is a first length condition, and further including, when the first hash chain does not satisfy the quality condition:

determining a second hash chain index corresponding to the first position in the input data buffer based on a second group of bytes accessed from the input data buffer beginning at a second look-ahead offset from the first position, the second look-ahead offset being larger than the first look-ahead offset;

in response to determining a second hash chain, which is indexed in memory by the second hash chain index, satisfies the quality condition, searching the input data buffer at respective adjusted buffer positions corresponding to ones of a second set of buffer positions stored in the second hash chain being offset by the second look-ahead offset to find a fourth string of data bytes matching a third string of data bytes beginning at the first position in the input data buffer; and in response to determining the fourth string of data bytes satisfies a second length condition, providing a relative position and a length of the fourth string of data bytes to an encoder to output the compressed data corresponding to the input data buffer.

17. The data compression method as defined in claim 16, wherein the second string of data bytes satisfies the first length condition when the length of the second string of data bytes is greater than or equal to a sum of the first look-ahead offset and a number, the fourth string of data bytes satisfies the second length condition when the length of the fourth string of data bytes is greater than or equal to a sum of the second look-ahead offset and the number, and the number corresponds to a number of bytes included in the first group of bytes and a number of bytes included in the second group of bytes.

18. The data compression method as defined in claim 11, wherein the length condition is a first length condition, and further including, when the second string of data bytes does not satisfy the first length condition:
  determining a second hash chain index corresponding to the first position in the input data buffer based on a second group of bytes accessed from the input data buffer beginning at the first position in the input data buffer;
  searching the input data buffer at respective ones of a subset of a second set of buffer positions stored in a second hash chain, which is indexed in memory by the second hash chain index, to find a fourth string of data bytes matching a third string of data bytes beginning at the first position in the input data buffer; and
  in response to determining the fourth string of data bytes satisfies a second length condition, providing a relative position and a length of the fourth string of data bytes to an encoder to output the compressed data corresponding to the input data buffer.

19. The data compression method as defined in claim 18, wherein the fourth string of data bytes satisfies the second length condition when the length of the second string of data bytes is between a first number corresponding to a number of bytes included in the second group of bytes and a second number equal to one less than a sum of the first look-ahead offset and the number of bytes included in the second group of bytes.

20. The data compression method as defined in claim 18, wherein the subset of the second set of buffer positions stored in the second hash chain corresponds to a first number of buffer positions stored at the beginning of the second hash chain.

21. A tangible computer readable storage medium comprising computer readable instructions which, when executed, cause a processor to at least:
  determine a first hash chain index corresponding to a first position in an input data buffer based on a first group of bytes accessed from the input data buffer beginning at a first look-ahead offset from the first position;
  when a first hash chain, which is indexed in memory by the first hash chain index, satisfies a quality condition, search the input data buffer at respective adjusted buffer positions corresponding to ones of a first set of buffer positions stored in the first hash chain being offset by the first look-ahead offset to find a second string of data bytes matching a first string of data bytes beginning at the first position in the input data buffer; and
  when the second string of data bytes satisfies a length condition, provide a relative position and a length of the second string of data bytes to an encoder to output compressed data corresponding to the input data buffer.

22. The storage medium as defined in claim 21, wherein the length condition is a first length condition, and when the first hash chain does not satisfy the quality condition, the instructions, when executed, further cause the processor to:
  determine a second hash chain index corresponding to the first position in the input data buffer based on a second group of bytes accessed from the input data buffer beginning at a second look-ahead offset from the first position, the second look-ahead offset being larger than the first look-ahead offset;
  when a second hash chain, which is indexed in memory by the second hash chain index, satisfies the quality condition, search the input data buffer at respective adjusted buffer positions corresponding to ones of a second set of buffer positions stored in the second hash chain being offset by the second look-ahead offset to find a fourth string of data bytes matching a third string of data bytes beginning at the first position in the input data buffer; and
  when the fourth string of data bytes satisfies a second length condition, provide a relative position and a length of the fourth string of data bytes to an encoder to output the compressed data corresponding to the input data buffer.

23. The storage medium as defined in claim 22, wherein the second string of data bytes satisfies the first length condition when the length of the second string of data bytes is greater than or equal to a sum of the first look-ahead offset and a number, the fourth string of data bytes satisfies the second length condition when the length of the fourth string of data bytes is greater than or equal to a sum of the second look-ahead offset and the number, and the number corresponds to a number of bytes included in the first group of bytes and a number of bytes included in the second group of bytes.

24. The storage medium as defined in claim 21, wherein the length condition is a first length condition, and when the second string of data bytes does not satisfy the first length condition, the instructions, when executed, further cause the processor to:
  determine a second hash chain index corresponding to the first position in the input data buffer based on a second group of bytes accessed from the input data buffer beginning at the first position in the input data buffer;
  search the input data buffer at respective ones of a subset of a second set of buffer positions stored in a second hash chain, which is indexed in memory by the second hash chain index, to find a fourth string of data bytes matching a third string of data bytes beginning at the first position in the input data buffer; and
  when the fourth string of data bytes satisfies a second length condition, provide a relative position and a length of the fourth string of data bytes to an encoder to output the compressed data corresponding to the input data buffer.

25. The storage medium as defined in claim 24, wherein the fourth string of data bytes satisfies the second length condition when the length of the second string of data bytes is between a first number corresponding to a number of bytes included in the second group of bytes and a second number equal to one less than a sum of the first look-ahead offset and the number of bytes included in the second group of bytes.

* * * * *